(12) United States Patent
Moriwaki et al.

(10) Patent No.: US 6,563,178 B2
(45) Date of Patent: May 13, 2003

(54) SEMICONDUCTOR DEVICE AND METHOD FOR FABRICATING THE DEVICE

(75) Inventors: Masaru Moriwaki, Osaka (JP); Takayuki Yamada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 107 days.

(21) Appl. No.: 09/818,550

(22) Filed: Mar. 28, 2001

(65) Prior Publication Data

US 2001/0027005 A1 Oct. 4, 2001

(30) Foreign Application Priority Data

Mar. 29, 2000 (JP) ........................................ 2000-090166

(51) Int. Cl.[7] .............................................. H01L 29/94
(52) U.S. Cl. ...................... 257/369; 257/379; 257/394
(58) Field of Search ................................ 257/369, 379, 257/394; 438/199, 203, 586

(56) References Cited

U.S. PATENT DOCUMENTS

| 6,143,593 A | * | 11/2000 | Augusto | ..................... 438/199 |
| 6,440,867 B1 | * | 8/2002 | Besser et al. | ............... 438/721 |
| 6,444,512 B1 | * | 9/2002 | Madhukar et al. | .......... 438/203 |
| 6,492,249 B2 | * | 12/2002 | Xiang et al. | ................ 438/586 |

FOREIGN PATENT DOCUMENTS

| JP | 08-37296 | 2/1996 |
| JP | 10-189966 | 7/1998 |

* cited by examiner

*Primary Examiner*—David Nelms
*Assistant Examiner*—Dao H. Nguyen
(74) *Attorney, Agent, or Firm*—Nixon Peabody LLP; Donald R. Studebaker

(57) ABSTRACT

A first gate electrode for an n-channel MOSFET includes first and second metal films and a low-resistivity metal film. The first metal film has been deposited on a first gate insulating film and is made of a first metal having a work function located closer to the conduction band of silicon with reference to an intermediate level of silicon bandgap. The second metal film has been deposited on the first metal film and is made of a second metal having a work function located closer to the valence band of silicon with reference to the intermediate level of silicon bandgap. The low-resistivity metal film has been deposited on the second metal film. A second gate electrode for a p-channel MOSFET includes: the second metal film, which has been deposited on a second gate insulating film and is made of the second metal; and the low-resistivity metal film deposited on the second metal film.

10 Claims, 11 Drawing Sheets

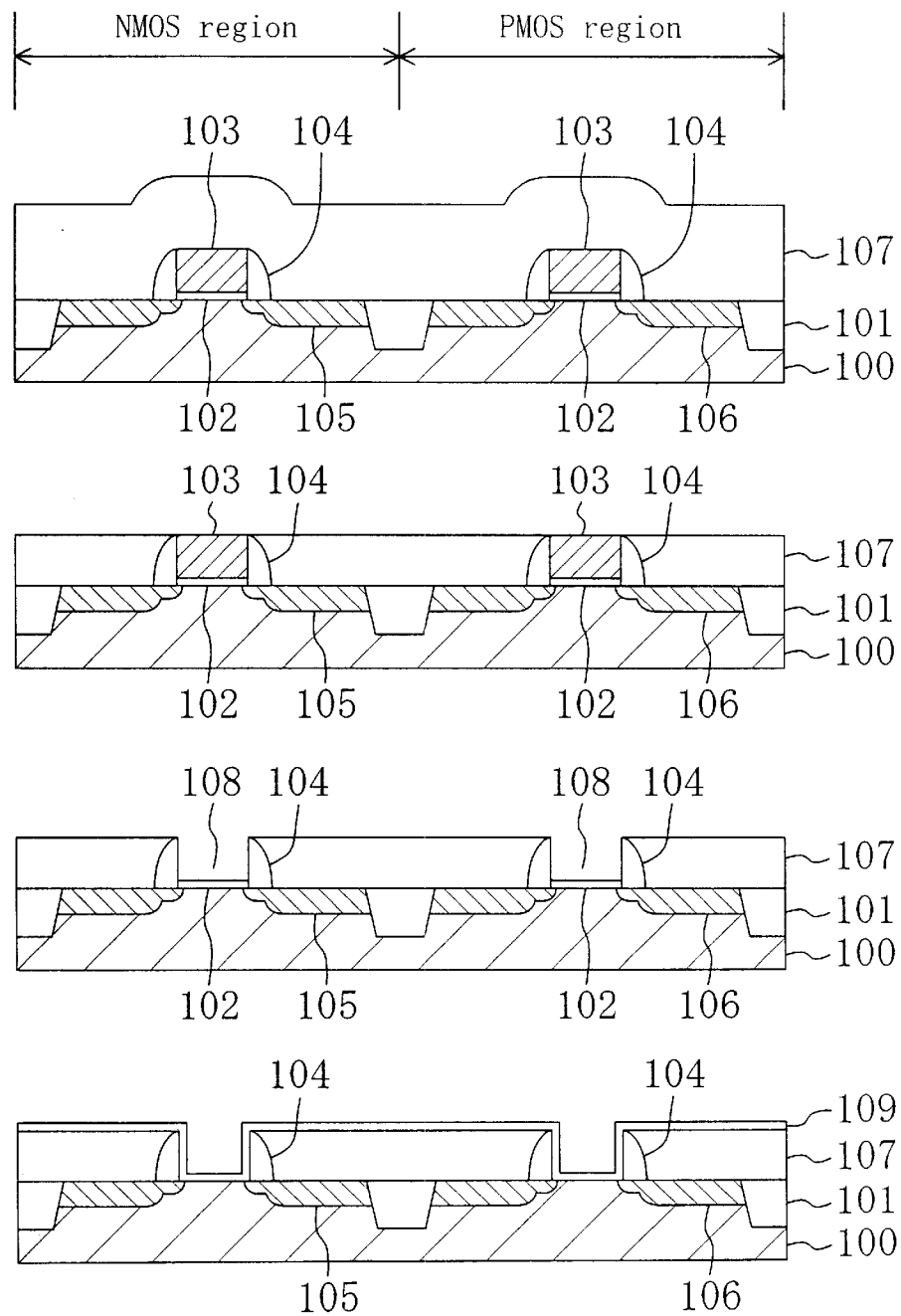

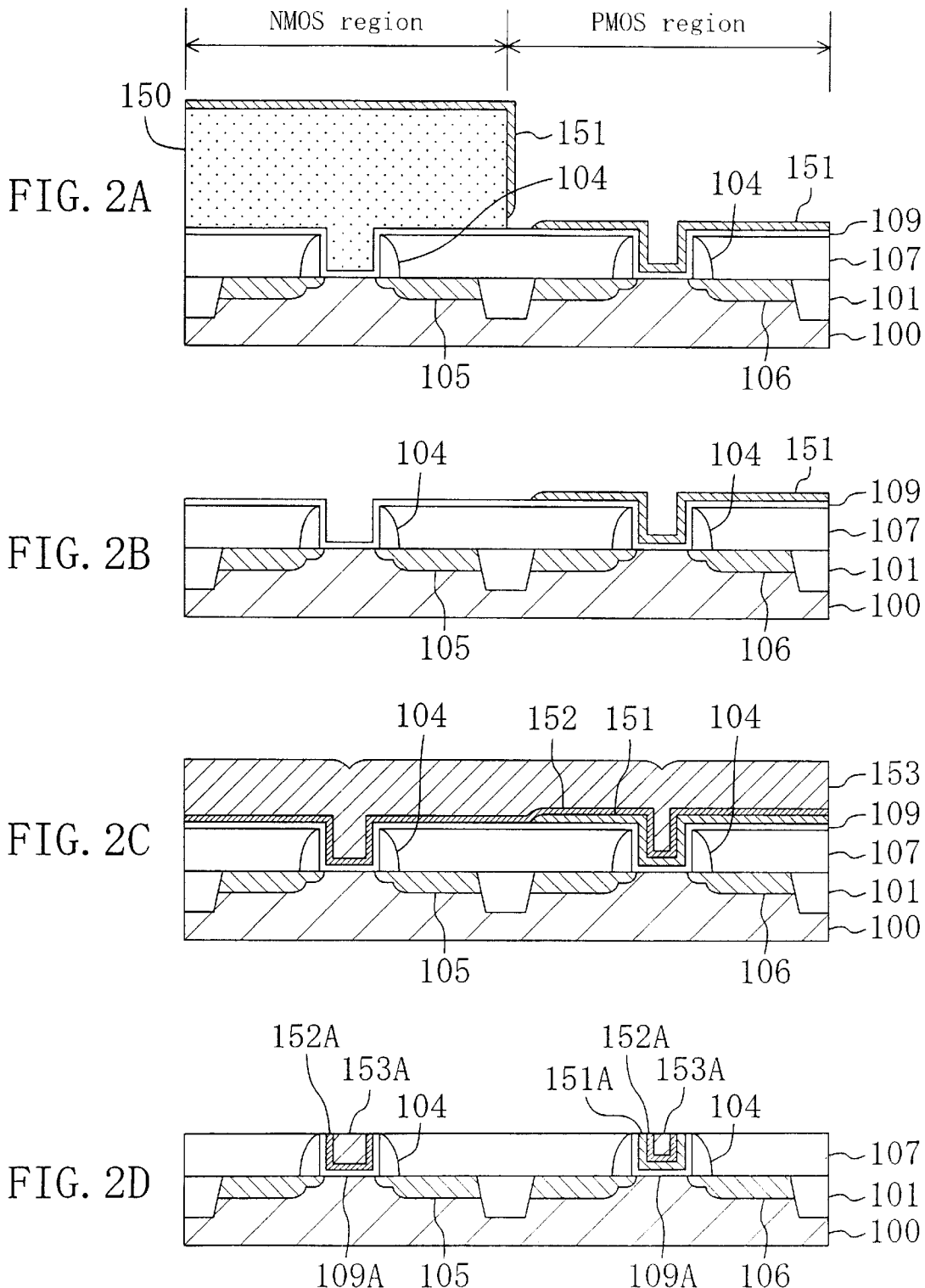

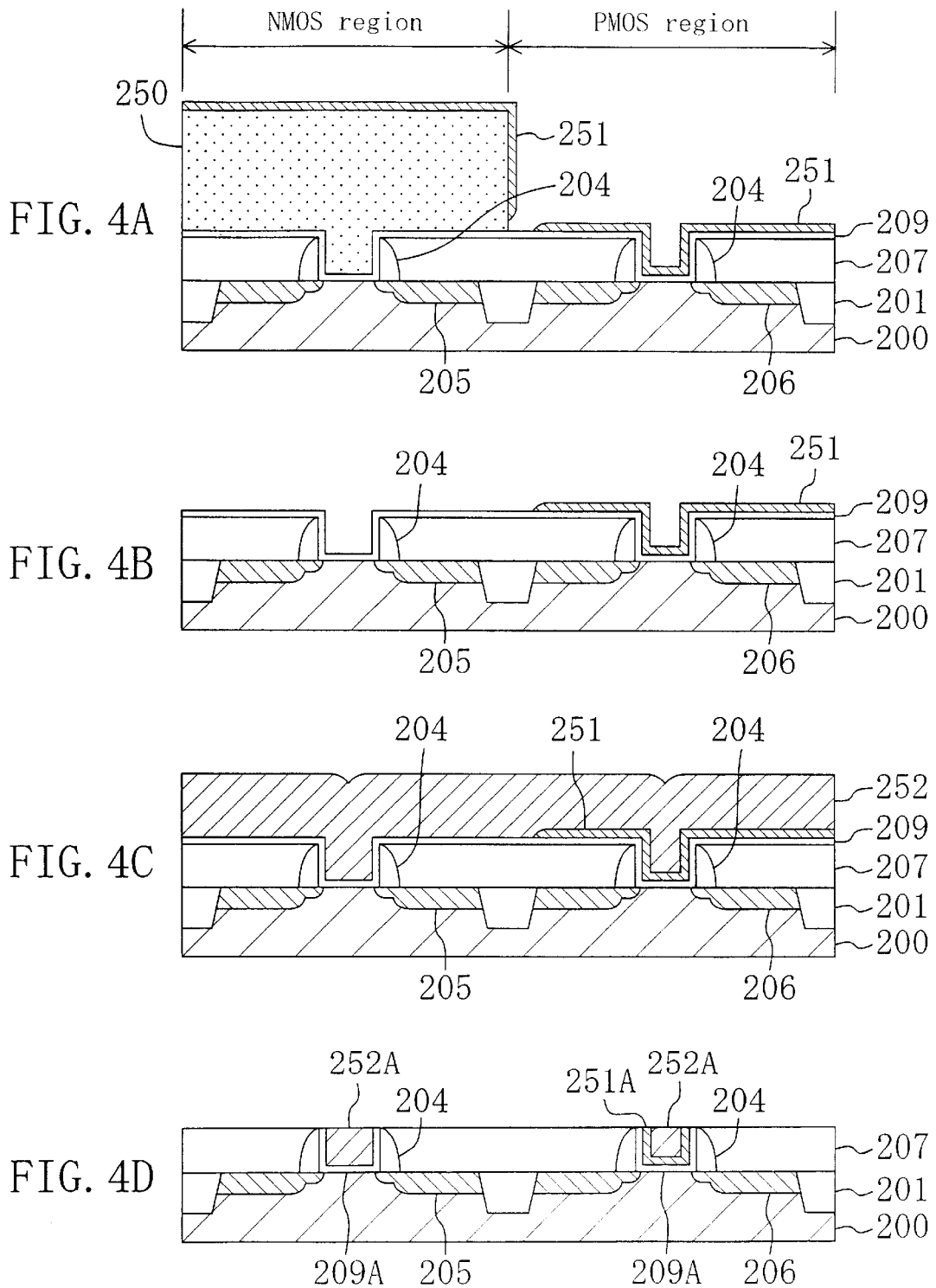

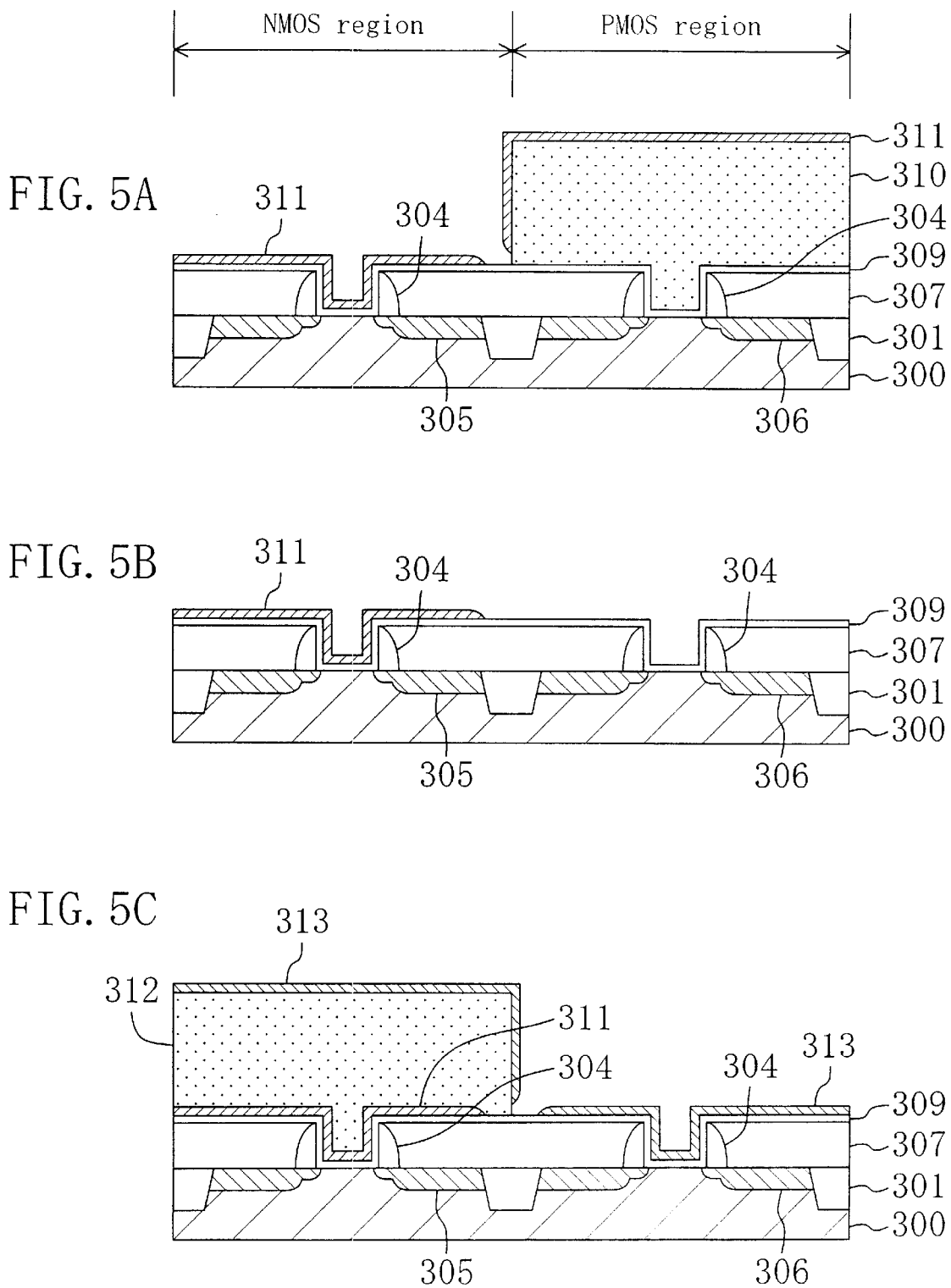

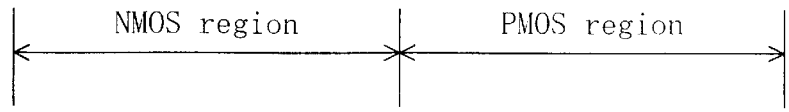
FIG. 6A
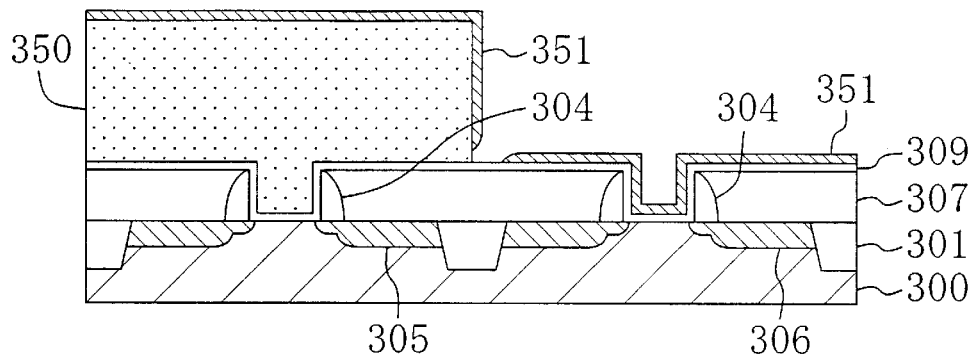
FIG. 6B
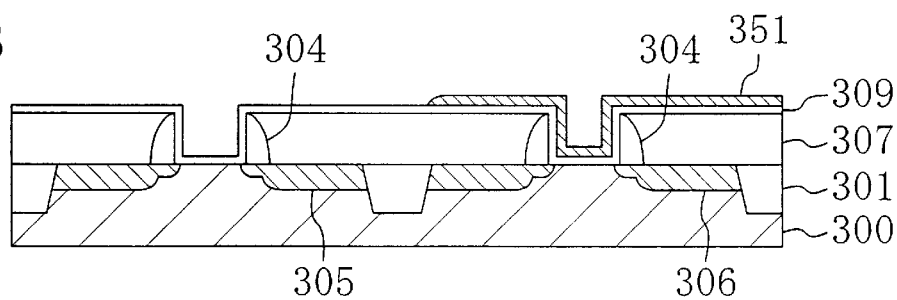
FIG. 6C
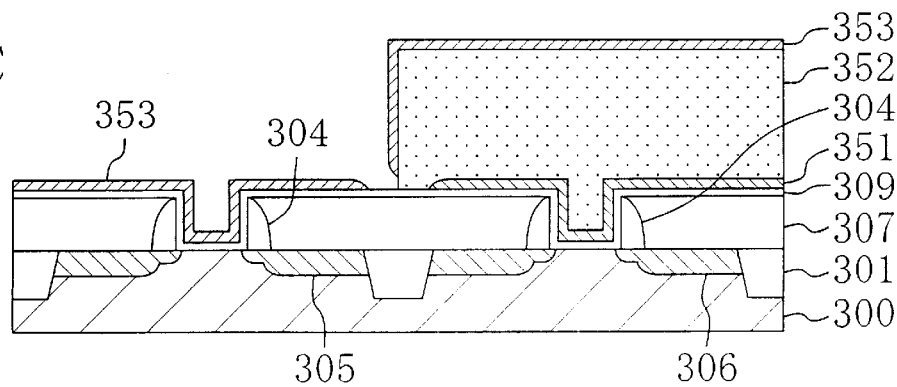

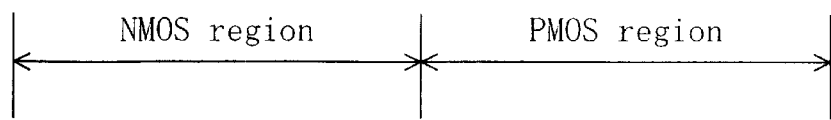
FIG. 6D
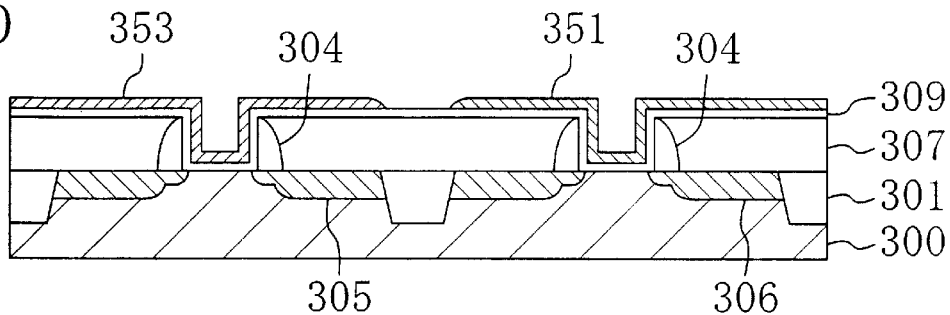
FIG. 6E
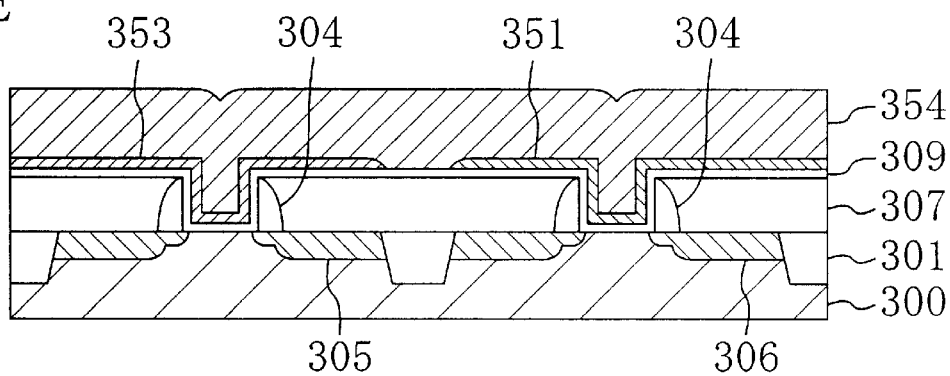
FIG. 6F
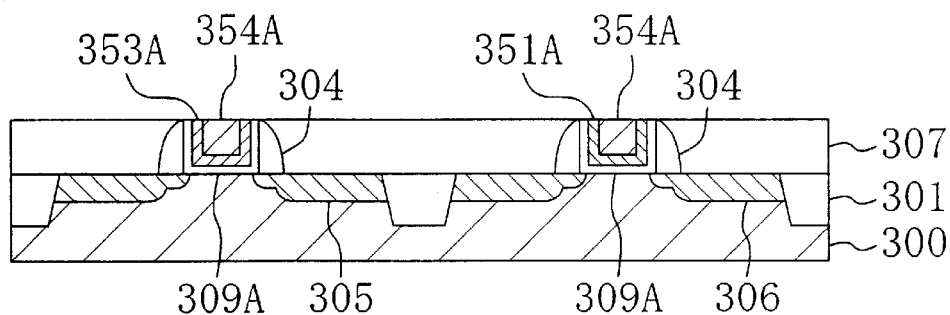

SEMICONDUCTOR DEVICE AND METHOD FOR FABRICATING THE DEVICE

BACKGROUND OF THE INVENTION

The present invention relates to a semiconductor device including n- and p-channel MOSFETs, each of which has a metal gate electrode, and also relates to a method for fabricating the device.

Recently, the process technology of semiconductor devices has been developed so much that a tremendously great number of semiconductor devices can now be integrated together on a single chip to realize a desired high-speed operation. Thanks to the marvelous development like this, MOSFETs have also been downsized year after year. However, as the gate insulating film of a MOSFET is thinned to catch up with this MOSFET downsizing trend, the drivability of the MOSFET decreases more and more noticeably. This is because the thinner the gate insulating film, the more and more depleted the known gate electrode of polysilicon.

Accordingly, to solve this problem, a metal gate process, in which the gate electrode is made of an alternative metal material that can suppress the gate depletion, has lately been researched and developed vigorously. A gate electrode made of such an alternative metal material will be herein called a "metal gate". This metal gate can effectively contribute to reduction in signal propagation delay caused by the gate electrode, because the gate electrode has a relatively low resistivity. For that reason, the metal gate can increase the drivability of a MOSFET and can also reduce the signal propagation delay, thus enhancing the overall performance of the MOSFET. The metal gate is usually formed out of a single-layer refractory metal film of W or TiN or a multi-layer structure consisting of two types of metal films. In the latter case, of the metal film is made of a metal (e.g., Al) having a low melting point but a very low resistivity, while the other metal film is made of a refractory metal like TiN.

Also, if the gate insulating film of $SiO_2$ for a known MOSFET is thinned, then a tunneling current likely flows through the gate insulating film, thus adversely increasing the leakage current flowing through the gate electrode.

Thus, to eliminate this problem, the effective thickness of a gate insulating film is tentatively increased by using a high dielectric constant material such as $Ta_2O_5$ for the gate insulating film according to a proposed technique.

In a normal MOSFET fabrication process, however, after a gate electrode has been formed, an annealing process is usually performed at an elevated temperature to activate a dopant that has been introduced into source/drain regions. Accordingly, it is very difficult to attain sufficiently high thermal stability while using a low melting point material like Al for the gate electrode and a high dielectric constant material like $Ta_2O_5$ for the gate insulating film.

In view of these problems, a method for fabricating a semiconductor device while using those thermally unstable materials for the gate electrode and gate insulating film was proposed in Japanese Laid-Open Publication No. 10-189966, for example. Hereinafter, the method disclosed in this document will be described with reference to FIGS. 8A through 8D.

First, as shown in FIG. 8A, an isolation region 11 is defined in a surface region of a p-type silicon substrate 10. Next, a silicon dioxide film and a polysilicon film are deposited over the substrate 10 and then patterned, thereby forming a dummy gate insulating film 12 and a dummy gate electrode 13. Thereafter, a sidewall 14 of silicon nitride is formed on the side faces of the dummy gate electrode 13. Subsequently, using the dummy gate electrode 13 and sidewall 14 as a mask, ions of a dopant are implanted into the substrate 10 and then an annealing process is performed to activate the dopant introduced. In this manner, a doped layer 15, which will be source/drain regions, is formed. Subsequently, an interlayer dielectric film 16 of silicon dioxide is deposited over the dummy gate electrode 13 and then planarized by a CMP process, thereby exposing the upper surface of the dummy gate electrode 13.

Next, as shown in FIG. 8B, the dummy gate electrode 13 and dummy gate insulating film 12 are removed selectively to form a recessed groove 17. Then, as shown in FIG. 8C, a $Ta_2O_5$ film 18 and a metal film 19 of TiW or W are deposited in this order over the interlayer dielectric film 16.

Subsequently, as shown in FIG. 8D, excessive parts of the $Ta_2O_5$ and metal films 18 and 19, exposed on the interlayer dielectric film 16, are removed by a CMP process, thereby forming a gate insulating film 18A and a gate electrode 19A out of the $Ta_2O_5$ and metal films 18 and 19, respectively.

In this known method, ions of a dopant are implanted into the substrate 10 using the dummy gate electrode 13 and sidewall 14 as a mask, and an annealing process is performed to activate the dopant introduced. Then, after the dummy gate electrode 13 and dummy gate insulating film 12 have been removed, the gate insulating film 18A and gate electrode 19A are formed. That is to say, according to this method, the gate insulating film 18A and gate electrode 19A are not subjected to the annealing process at a high temperature. For that reason, a low melting point material like Al can be used for the gate electrode and $Ta_2O_5$ can be used for the gate insulating film.

However, if a complementary MOS (CMOS) device, including two MOSFETs each having a metal gate, is fabricated by this known method, the MOSFETs can have their performance enhanced. But it is difficult to set a low threshold voltage for these MOSFETs. Hereinafter, this problem will be described in further detail.

An LSI of today is required to operate with its power dissipation further reduced. For that purpose, a drive voltage for a MOSFET needs to be further reduced. So the threshold voltage of a MOSFET should be as low as 0.2 to 0.3 V, whether the MOSFET is of n-channel type or p-channel type.

In a CMOS device including polysilicon gate electrodes, the gate electrodes of n- and p-channel MOSFETs are doped with n- and p-type dopants, respectively, so that the difference in work function between these gate electrodes, and eventually the threshold voltages of these MOSFETs, can be reduced.

However, the metal gate cannot be doped with an n- or p-type dopant. So the metal gate electrodes of n- and p-channel MOSFETs should be made of the same material. Accordingly, it is difficult to ensure high performance and low threshold voltages for these MOSFETs at a time.

For example, suppose a material for metal gate electrodes has a work function closer to the conduction band of the silicon bandgap. In that case, it is easy to implement an n-channel MOSFET as a surface-channel transistor, which usually exhibits high performance, so that the n-channel MOSFET has a threshold voltage as low as 0.2 to 0.3 V. However, to set the threshold voltage of a p-channel MOSFET to as low as 0.2 to 0.3 V, part of the channel region of the p-channel MOSFET near its surface should be subjected to a counter-doping process. Accordingly, the p-channel MOSFET should be realized as a buried-channel transistor, which is usually subject to short channel effects. As a result, it is difficult to ensure desired high performance for the p-channel MOSFET of that type.

Another possibility is that a material for metal gate electrodes has a work function closer to the valence band of the silicon bandgap. In that case, it is easy to implement a p-channel MOSFET as a surface-channel transistor, which usually exhibits high performance, so that the p-channel MOSFET has a threshold voltage as low as 0.2 to 0.3 V. However, to set the threshold voltage of an n-channel MOSFET to as low as 0.2 to 0.3 V, part of the channel region of the n-channel MOSFET near its surface should be subjected to a counter-doping process. Accordingly, the n-channel MOSFET should be realized as a buried-channel transistor, which is usually subject to short channel effects. As a result, it is difficult to ensure desired high performance for the n-channel MOSFET of that type.

The other possibility is that a material for metal gate electrodes has a work function located near the silicon midgap, i.e., an intermediate level of the silicon bandgap. Then, n- and p-channel MOSFETs can be both implemented as surface-channel transistors. But the threshold voltages of the n- and p-channel MOSFETs should be as high as 0.5 to 0.6 V.

SUMMARY OF THE INVENTION

It is therefore an object of the present invention to ensure high performance and low threshold voltages for both of n- and p-channel MOSFETs included in a CMOS device.

A first inventive semiconductor device includes n- and p-channel MOSFETS. The n-channel MOSFET includes: a first gate insulating film; and a first gate electrode formed on the first gate insulating film. The first gate insulating film is deposited on the bottom of a first recessed groove that has been provided for forming the first gate electrode in a dielectric film deposited on a silicon substrate. The p-channel MOSFET includes: a second gate insulating film; and a second gate electrode formed on the second gate insulating film. The second gate insulating film is deposited on the bottom of a second recessed groove that has been provided for forming the second gate electrode in the dielectric film. In this device, the first gate electrode includes first and second metal films and first low-resistivity metal film. The first metal film has been deposited on the first gate insulating film, is made of a first metal or a compound thereof and has a first recess inside the first recessed groove. The first metal has a work function located closer to the conduction band of silicon with reference to an intermediate level of silicon bandgap. The second metal film has been deposited on the first metal film, is made of a second metal or a compound thereof and has a second recess inside the first recess. The second metal has a work function located closer to the valence band of silicon with reference to the intermediate level of silicon bandgap. And the first low-resistivity metal film is made of a low-resistivity metal, with which the second recess is filled. In this device, the first gate electrode includes a third metal film and a second low-resistivity metal film. The third metal film has been deposited on the second gate insulating film, is made of the second metal or the compound thereof and has a third recess inside the second recessed groove. And the second low-resistivity metal film is made of the low-resistivity metal, which the third recess is filled.

In the first inventive device, the difference in work function between the first gate electrode of the n-channel MOSFET and the silicon substrate is the difference in work function between the first metal film and the silicon substrate. In other words, the work function difference is the difference between the work function of the first metal, located closer to the conduction band of silicon with reference to an intermediate level of silicon bandgap, and that of silicon. Accordingly, the n-channel MOSFET can have its threshold voltage lowered. Also, the difference in work function between the second gate electrode of the p-channel MOSFET and the silicon substrate is the difference in work function between the third metal film and the silicon substrate. In other words, the work function difference is the difference between the work function of the second metal, located closer to the valence band of silicon with reference to an intermediate level of silicon bandgap, and that of silicon. Accordingly, the p-channel MOSFET can also have its threshold voltage lowered.

In addition, the first and second gate electrodes both include the low-resistivity metal film. Thus, even if the first, second and third metal films are made of high-resistivity metals, the first and second gate electrodes will not have their resistivity increased.

Furthermore, neither the n- nor p-channel MOSFET has to be subjected to a counter-doping process through the surface of their channel region. Accordingly, both of these MOSFETs are implementable as surface-channel transistors exhibiting high performance.

A second inventive semiconductor device includes n- and p-channel MOSFETs. The n-channel MOSFET includes: a first gate insulating film; and a first gate electrode formed on the first gate insulating film. The first gate insulating film is deposited on the bottom of a first recessed groove that has been provided for forming the first gate electrode in a dielectric film deposited on a silicon substrate. The p-channel MOSFET includes: a second gate insulating film; and a second gate electrode formed on the second gate insulating film. The second gate insulating film is deposited on the bottom of a second recessed groove that has been provided for forming the second gate electrode in the dielectric film. In this device, the second gate electrode includes first and second metal films and first low-resistivity metal film. The first metal film has been deposited on the second gate insulating film, is made of a first metal or a compound thereof and has a first recess inside the second recessed groove. The first metal has a work function located closer to the valence band of silicon with reference to an intermediate level of silicon bandgap. The second metal film has been deposited on the first metal film, is made of a second metal or a compound thereof and has a second recess inside the first recess. The second metal has a work function located closer to the conduction band of silicon with reference to the intermediate level of silicon bandgap. The first low-resistivity metal film is made of a low-resistivity metal and with which the second recess is filled. In this device, the first gate electrode includes a third metal film and a second low-resistivity metal film. The third metal film has been deposited on the first gate insulating film, is made of the second metal or the compound thereof and has a third recess inside the first recessed groove. The second low-resistivity metal film is made of the low-resistivity metal, with which the third recess is filled.

In the second inventive device, the difference in work function between the first gate electrode of the n-channel MOSFET and the silicon substrate is the difference in work function between the third metal film and the silicon substrate. In other words, the work function difference is the difference between the work function of the second metal, located closer to the conduction band of silicon with reference to an intermediate level of silicon bandgap, and that of silicon. Accordingly, the n-channel MOSFET can have its threshold voltage lowered. Also, the difference in work function between the second gate electrode of the p-channel MOSFET and the silicon substrate is the difference in work function between the first metal film and the silicon substrate. In other words, the work function difference is the difference between the work function of the first metal, located closer to the valence band of silicon with reference to an intermediate level of silicon bandgap, and that of silicon. Accordingly, the p-channel MOSFET can also have its threshold voltage lowered.

In addition, the first and second gate electrodes both include the low-resistivity metal film. Thus, even if the first, second and third metal films are made of high-resistivity metals, the first and second gate electrodes will not have their resistivity increased.

Furthermore, neither the n- nor p-channel MOSFET has to be subjected to a counter-doping process through the surface of their channel region. Accordingly, both of these MOSFETs are implementable as surface-channel transistors exhibiting high performance.

A third inventive semiconductor device includes n- and p-channel MOSFETS. The n-channel MOSFET includes: a first gate insulating film; and a first gate electrode formed on the first gate insulating film. The first gate insulating film is deposited on the bottom of a first recessed groove that has been provided for forming the first gate electrode in a dielectric film deposited on a silicon substrate. The p-channel MOSFET includes: a second gate insulating film; and a second gate electrode formed on the second gate insulating film. The second gate insulating film is deposited on the bottom of a second recessed groove that has been provided for forming the second gate electrode in the dielectric film. In this device, the first gate electrode includes a metal film and a first low-resistivity metal film. The metal film has been deposited on the first gate insulating film, is made of a first metal or a compound thereof and has a recess inside the first recessed groove. The first metal has a work function located closer to the conduction band of silicon with reference to an intermediate level of silicon bandgap. The first low-resistivity metal film fills the recess and is made of a second metal or a compound thereof. The second metal is a low-resistivity metal having a work function located closer to the valence band of silicon with reference to the intermediate level of silicon bandgap. In this device, the second gate electrode includes a second low-resistivity metal film. The second low-resistivity metal film has been deposited on the second gate insulating film to fill the second recessed groove and is made of the second metal or the compound thereof.

In the third inventive device, the difference in work function between the first gate electrode of the n-channel MOSFET and the silicon substrate is the difference in work function between the metal film and the silicon substrate. In other words, the work function difference is the difference between the work function of the first metal, located closer to the conduction band of silicon with reference to an intermediate level of silicon bandgap, and that of silicon. Accordingly, the n-channel MOSFET can have its threshold voltage lowered. Also, the difference in work function between the second gate electrode of the p-channel MOSFET and the silicon substrate is the difference in work function between the second low-resistivity metal film and the silicon substrate. In other words, the work function difference is the difference between the work function of the second metal, located closer to the valence band of silicon with reference to an intermediate level of silicon bandgap, and that of silicon. Accordingly, the p-channel MOSFET can also have its threshold voltage lowered.

In addition, the first gate electrode includes the low-resistivity metal film. Thus, even if the metal film is made of a high-resistivity metal, the first gate electrode will not have its resistivity increased. Moreover, the second gate electrode is made of the low-resistivity metal film and can also have its resistivity reduced.

Furthermore, neither the n- nor p-channel MOSFET has to be subjected to a counter-doping process through the surface of their channel region. Accordingly, both of these MOSFETs are implementable as surface-channel transistors exhibiting high performance.

A fourth inventive semiconductor device includes n- and p-channel MOSFETs. The n-channel MOSFET includes: a first gate insulating film; and a first gate electrode formed on the first gate insulating film. The first gate insulating film is deposited on the bottom of a first recessed groove that has been provided for forming the first gate electrode in a dielectric film deposited on a silicon- substrate. The p-channel MOSFET includes: a second gate insulating film; and a second gate electrode formed on the second gate insulating film. The second gate insulating film is deposited on the bottom of a second recessed groove that has been provided for forming the second gate electrode in the dielectric film. In this device, the second gate electrode includes a metal film and first low-resistivity metal film. The metal film has been deposited on the second gate insulating film, is made of a first metal or a compound thereof and has a recess inside the second recessed groove. The first metal has a work function located closer to the valence band of silicon with reference to an intermediate level of silicon bandgap. The first low-resistivity metal film fills the recess and is made of a second metal or a compound thereof. The second metal is a low-resistivity metal having a work function located closer to the conduction band of silicon with reference to the intermediate level of silicon bandgap. In this device, the first gate electrode includes a second low-resistivity metal film. The second low-resistivity metal film has been deposited on the first gate insulating film to fill the first recessed groove and is made of the second metal or the compound thereof.

In the fourth inventive device, the difference in work function between the first gate electrode of the n-channel MOSFET and the silicon substrate is the difference in work function between the second low-resistivity metal film and the silicon substrate. In other words, the work function difference is the difference between the work function of the second metal, located closer to the conduction band of silicon with reference to an intermediate level of silicon bandgap, and that of silicon. Accordingly, the n-channel MOSFET can have its threshold voltage lowered. Also, the difference in work function between the second gate electrode of the p-channel MOSFET and the silicon substrate is the difference in work function between the metal film and the silicon substrate. In other words, the work function difference is the difference between the work function of the first metal, located closer to the valence band of silicon with reference to an intermediate level of silicon bandgap, and that of silicon. Accordingly, the p-channel MOSFET can also have its threshold voltage lowered.

In addition, the first gate electrode is made of the low-resistivity metal film, and can have its resistivity reduced. Moreover, the second gate electrode includes the low-resistivity metal film. Thus, even if the metal film is made of a high-resistivity metal, the second gate electrode will not have its resistivity increased.

Furthermore, neither the n- nor p-channel MOSFET has to be subjected to a counter-doping process through the surface of their channel region. Accordingly, both of these MOSFETs are implementable as surface-channel transistors exhibiting high performance.

A fifth inventive semiconductor device includes n- and p-channel MOSFETs. The n-channel MOSFET includes: a first gate insulating film; and a first gate electrode formed on the first gate insulating film. The first gate insulating film is deposited on the bottom of a first recessed groove that has been provided for forming the first gate electrode in a dielectric film deposited on a silicon substrate. The p-channel MOSFET includes: a second gate insulating film; and a second gate electrode formed on the second gate insulating film. The second gate insulating film is deposited on the bottom of a second recessed groove that has been provided for forming the second gate electrode in the dielectric film. In this device, the first gate electrode includes a first metal film and a first low-resistivity metal film. The first metal film has been deposited on the first gate insulating film, is made of a first metal or a compound thereof and has a first recess inside the first recessed groove. The first metal has a work function located closer to the conduction band of silicon with reference to an intermediate level of silicon bandgap. The first low-resistivity metal film fills the first recess and is made of a low-resistivity metal. In this device, the second gate electrode includes a second metal film and a second low-resistivity metal film. The second metal film has been deposited on the second gate insulating film, is made of a second metal or a compound thereof and has a second recess inside the second recessed groove. The second metal has a work function located closer to the valence band of silicon with reference to the intermediate level of silicon bandgap. The second low-resistivity metal film fills the second recess and is made of the low-resistivity metal.

In the fifth inventive device, the difference in work function between the first gate electrode of the n-channel MOSFET and the silicon substrate is the difference in work function between the first metal film and the silicon substrate. In other words, the work function difference is the difference between the work function of the first metal, located closer to the conduction band of silicon with reference to an intermediate level of silicon bandgap, and that of silicon. Accordingly, the n-channel MOSFET can have its threshold voltage lowered. Also, the difference in work function between the second gate electrode of the p-channel MOSFET and the silicon substrate is the difference in work function between the second metal film and the silicon substrate. In other words, the work function difference is the difference between the work function of the second metal, located closer to the valence band of silicon with reference to an intermediate level of silicon bandgap, and that of silicon. Accordingly, the p-channel MOSFET can also have its threshold voltage lowered.

In addition, the first and second gate electrodes both include the low-resistivity metal film. Thus, even if the first and second metal films are made of high-resistivity metals, the first and second gate electrodes will not have their resistivity increased.

Furthermore, neither the n- nor p-channel MOSFET has to be subjected to a counter-doping process through the surface of their channel region. Accordingly, both of these MOSFETs are implementable as surface-channel transistors exhibiting high performance.

In the fifth inventive device, in particular, each of the first and second gate electrodes is made of two types of metal films, i.e., the first metal film and first low-resistivity metal film or the second metal film and second low-resistivity metal film. Accordingly, a ratio of the volume of the first or second metal film, which determines the work function difference, to the total volume of the first or second recessed groove can be reduced. Thus, even when very small MOSFETs should be formed, the first and second recessed grooves can be filled with the low-resistivity metal films as intended.

As can be seen, any of the first through fifth inventive devices can advantageously reduce the threshold voltages of the n- and p-channel MOSFETs and the resistivity of the first and second gate electrodes thereof so that these MOSFETs are implementable as surface-channel transistors. As a result, a semiconductor device, including high-performance n- and p-channel MOSFETs with low threshold voltages, is realized.

A first inventive method for fabricating a semiconductor device includes the step of a) forming first and second recessed grooves by removing a part of a dielectric film deposited on a silicon substrate from a region where an n-channel MOSFET will be formed and another part of the dielectric film from a region where a p-channel MOSFET will be formed, respectively. The first and second recessed grooves are provided to form first and second gate electrodes for the n- and p-channel MOSFETs, respectively. The method further includes the steps of: b) forming first and second gate insulating films on the bottom of the first and second recessed grooves, respectively; and c) defining a resist pattern over the dielectric film so that the first recessed groove is exposed but that the second recessed groove is covered with the resist pattern. The method further includes the step of d) forming a first metal film, having a first recess, inside the first recessed groove by depositing a first metal or a compound thereof over the dielectric film and the resist pattern, and then lifting the resist pattern off along with excessive parts of the first metal or the compound thereof that have been deposited on the resist pattern. The first metal has a work function located closer to the conduction band of silicon with reference to an intermediate level of silicon bandgap. The method further includes the step of e) forming second and third metal films inside the first recess and the second recessed groove, respectively, by depositing a second metal or a compound thereof over the dielectric film. The second metal has a work function located closer to the valence band of silicon with reference to the intermediate level of silicon bandgap. The second and third metal films have second and third recesses, respectively. The method further includes the step of f) forming first and second low-resistivity metal films inside the second and third recesses, respectively, by depositing a low-resistivity metal over the dielectric film. And the method further includes the step of g) removing excessive parts of the low-resistivity metal and the second and first metals or the compounds thereof that have been deposited over the dielectric film, thereby forming the first and second gate electrodes for the n- and p-channel MOSFETs, respectively, so that the first gate electrode includes the first and second metal films and the first low-resistivity metal film and that the second gate electrode includes the third metal film and the second low-resistivity metal film.

In the first inventive method, a first metal film, made of a first metal with a work function located closer to the conduction band of silicon with reference to an intermediate level of silicon bandgap or a compound thereof, is selectively deposited inside a first recessed groove using a resist pattern. Thereafter, second and third metal films, both made of a second metal with a work function located closer to the valence band of silicon with reference to an intermediate level of silicon bandgap or a compound thereof, are deposited. And then first and second low-resistivity metal films are deposited over the second and third metal films, respectively. In this manner, a first gate electrode, consisting of the first and second metal films and first low-resistivity metal film, can be formed for the n-channel MOSFET, and a second gate electrode, consisting of the third metal film and second low-resistivity metal film, can be formed for the p-channel MOSFET. That is to say, the first inventive semiconductor device can be formed as intended.

A second inventive method for fabricating a semiconductor device includes the step of a) forming first and second recessed grooves by removing a part of a dielectric film deposited on a silicon substrate from a region where an n-channel MOSFET will be formed and another part of the dielectric film from a region where a p-channel MOSFET will be formed, respectively. The first and second recessed grooves are provided to form first and second gate electrodes for the n- and p-channel MOSFETS, respectively. The method also includes the steps of: b) forming first and second gate insulating films on the bottom of the first and second recessed grooves, respectively; and c) defining a resist pattern on the dielectric film so that the second recessed groove is exposed but that the first recessed groove is covered with the resist pattern. The method further includes the step of d) forming a first metal film, having a first recess, inside the second recessed groove by depositing a first metal or a compound thereof over the dielectric film and the resist pattern, and then lifting the resist pattern off along with excessive parts of the first metal or the compound thereof that have been deposited on the resist pattern. The first metal has a work function located closer to the valence band of silicon with reference to an intermediate level of silicon bandgap. The method further includes the step of e) forming second and third metal films inside the first recess and the first recessed groove, respectively, by depositing a second metal or a compound thereof over the dielectric film. The second metal has a work function located closer to the conduction band of silicon with reference to the intermediate level of silicon bandgap. The second and third metal films have second and third recesses, respectively. The method further includes the step of f) forming first and second low-resistivity metal films inside the second and third recesses, respectively, by depositing a low-resistivity metal over the dielectric film. And the method further includes the step of g) removing excessive parts of the low-resistivity metal and the second and first metals or the compounds thereof that have been deposited over the dielectric film, thereby forming the first and second gate electrodes for the n- and p-channel MOSFETs, respectively, so that the first gate electrode includes the third metal film and the second low-resistivity metal film and that the second gate electrode includes the first and second metal films and the first low-resistivity metal film.

In the second inventive method, a first metal film, made of a first metal with a work function located closer to the valence band of silicon with reference to an intermediate level of silicon bandgap or a compound thereof, is selectively deposited inside a second recessed groove using a resist pattern. Thereafter, second and third metal films, both made of a second metal with a work function located closer to the conduction band of silicon with reference to an intermediate level of silicon bandgap or a compound thereof, are deposited. And then first and second low-resistivity metal films are deposited over the second and third metal films, respectively. In this manner, a first gate electrode, consisting of the third metal film and second low-resistivity metal film, can be formed for the n-channel MOSFET, and a second gate electrode, consisting of the first and second metal films and first low-resistivity metal film, can be formed for the p-channel MOSFET. That is to say, the second inventive semiconductor device can be formed as intended.

A third inventive method for fabricating a semiconductor device includes the step of a) forming first and second recessed grooves by removing a part of a dielectric film deposited on a silicon substrate from a region where an n-channel MOSFET will be formed and another part of the dielectric film from a region where a p-channel MOSFET will be formed, respectively. The first and second recessed grooves are provided to form first and second gate electrodes for the n- and p-channel MOSFETs, respectively. The method further includes the steps of: b) forming first and second gate insulating films on the bottom of the first and second recessed grooves, respectively; and c) defining a resist pattern over the dielectric film so that the first recessed groove is exposed but that the second recessed groove is covered with the resist pattern. The method further includes the step of d) forming a metal film, having a recess, inside the first recessed groove by depositing a first metal or a compound thereof over the dielectric film and the resist pattern, and then lifting the resist pattern off along with excessive parts of the first metal or the compound thereof that have been deposited on the resist pattern. The first metal has a work function located closer to the conduction band of silicon with reference to an intermediate level of silicon bandgap. The method further includes the step of e) forming first and second low-resistivity metal films inside the recess and the second recessed groove, respectively, by depositing a second metal or a compound thereof over the dielectric film. The second metal is a low-resistivity metal that has a work function located closer to the valence band of silicon with reference to the intermediate level of silicon bandgap. And the method further includes the step of f) removing excessive parts of the second and first metals or the compounds thereof that have been deposited over the dielectric film, thereby forming the first and second gate electrodes for the n- and p-channel MOSFETs, respectively, so that the first gate electrode includes the metal film and the first low-resistivity metal film and that the second gate electrode is made of the second low-resistivity metal film.

In the third inventive method, a metal film, made of a first metal with a work function located closer to the conduction band of silicon with reference to an intermediate level of silicon bandgap or a compound thereof, is selectively deposited inside a first recessed groove using a resist pattern. Thereafter, first and second low-resistivity metal films, both made of a second metal that is a low-resistivity metal with a work function located closer to the valence band of silicon with reference to an intermediate level of silicon bandgap or a compound thereof, are deposited. In this manner, a first gate electrode, consisting of the metal film and first low-resistivity metal film, can be formed for the n-channel MOSFET, and a second gate electrode, made of the second low-resistivity metal film, can be formed for the p-channel MOSFET. That is to say, the third inventive semiconductor device can be formed as intended.

According to the third method, in particular, only two types of metal films, i.e., the metal film and low-resistivity metal film, have to be deposited to form the first and second gate electrodes. Thus, compared to the first or second inventive method, the step of depositing the third metal film can be omitted and the step of removing excessive parts of the metal film from the surface of the dielectric film can be performed more easily.

A fourth inventive method for fabricating a semiconductor device includes the step of a) forming first and second recessed grooves by removing a part of a dielectric film deposited on a silicon substrate from a region where an n-channel MOSFET will be formed and another part of the dielectric film from a region where a p-channel MOSFET will be formed, respectively. The first and second recessed grooves are provided to form first and second gate electrodes for the n- and p-channel MOSFETS, respectively. The method further includes the steps of: b) forming first and second gate insulating films on the bottom of the first and second recessed grooves, respectively; and c) defining a resist pattern on the dielectric film so that the second recessed groove is exposed but that the first recessed groove is covered with the resist pattern. The method further includes the step of d) forming a metal film, having a recess, inside the second recessed groove by depositing a first metal or a compound thereof over the dielectric film and the resist pattern, and then lifting the resist pattern off along with excessive parts of the f irst metal or the compound thereof that have been deposited on the resist pattern. The first metal has a work function located closer to the valence band of silicon with reference to an intermediate level of silicon bandgap. The method further includes the step of e) forming first and second low-resistivity metal films inside the recess and the first recessed groove, respectively, by depositing a second metal or a compound thereof over the dielectric film. The second metal is a low-resistivity metal that has a work function located closer to the conduction band of silicon with reference to the intermediate level of silicon bandgap. And the method further includes the step of f) removing excessive parts of the second and first metals or the compounds thereof that have been deposited over the dielectric film, thereby forming the first and second gate electrodes for the n- and p-channel MOSFETs, respectively, so that the first gate electrode is made of the second low-resistivity metal film and that the second gate electrode includes the metal film and the first low-resistivity metal film.

In the fourth inventive method, a metal film, made of a first metal with a work function located closer to the valence band of silicon with reference to an intermediate level of silicon bandgap or a compound thereof, is selectively deposited inside a second recessed groove using a resist pattern. Thereafter, first and second low-resistivity metal films, both made of a second metal that is a low-resistivity metal with a work function located closer to the conduction band of silicon with reference to an intermediate level of silicon bandgap or a compound thereof, are deposited. In this manner, a first gate electrode, made of the second low-resistivity metal film, can be formed for the n-channel MOSFET, and a second gate electrode, consisting of the metal film and first low-resistivity metal film, can be formed for the p-channel MOSFET. That is to say, the fourth inventive semiconductor device can be formed as intended.

According to the fourth method, in particular, only two types of metal films, i.e., the metal film and low-resistivity metal film, have to be deposited to form the first and second gate electrodes. Thus, compared to the first or second inventive method, the step of depositing the third metal film can be omitted and the step of removing excessive parts of the metal film from the surface of the dielectric film can be performed more easily.

A fifth inventive method for fabricating a semiconductor device includes the step of a) forming first and second recessed grooves by removing a part of a dielectric film deposited on a silicon substrate from a region where an n-channel MOSFET will be formed and another part of the dielectric film from a region where a p-channel MOSFET will be formed, respectively. The first and second recessed grooves are provided to form first and second gate electrodes for the n- and p-channel MOSFETs, respectively. The method further includes the steps of: b) forming first and second gate insulating films on the bottom of the first and second recessed grooves, respectively; and c) defining a first resist pattern on the dielectric film so that the first recessed groove is exposed but that the second recessed groove is covered with the first resist pattern. The method further includes the step of d) forming a first metal film, having a first recess, inside the first recessed groove by depositing a first metal or a compound thereof over the dielectric film and the first resist pattern, and then lifting the first resist pattern off along with excessive parts of the first metal or the compound thereof that have been deposited on the first resist pattern. The first metal has a work function located closer to the conduction band of silicon with reference to an intermediate level of silicon bandgap. The method further includes the steps of: e) defining a second resist pattern on the dielectric film so that the second recessed groove is exposed but that the first recess is covered with the second resist pattern; and f) forming a second metal film, having a second recess, inside the second recessed groove by depositing a second metal or a compound thereof over the dielectric film and the second resist pattern, and then lifting the second resist pattern off along with excessive parts of the second metal or the compound thereof that have been deposited on the second resist pattern. The second metal has a work function located closer to the valence band of silicon with reference to the intermediate level of silicon bandgap. The method further includes the steps of: g) forming first and second low-resistivity metal films inside the first and second recesses, respectively, by depositing a low-resistivity metal over the dielectric film; and h) removing excessive parts of the low-resistivity metal and the second and first metals or the compounds thereof that have been deposited over the dielectric film, thereby forming the first and second gate electrodes for the n- and p-channel MOSFETs, respectively, so that the first gate electrode includes the first metal film and the first low-resistivity metal film and that the second gate electrode includes the second metal film and the second low-resistivity metal film.

In the fifth inventive method, a first metal film, made of a first metal with a work function located closer to the conduction band of silicon with reference to an intermediate level of silicon bandgap or a compound thereof, is selectively deposited inside a first recessed groove using a first resist pattern. Then, a second metal film, made of a second metal with a work function located closer to the valence band of silicon with reference to an intermediate level of silicon bandgap or a compound thereof, is selectively deposited inside a second recessed groove using a second resist pattern. Thereafter, first and second low-resistivity metal films are deposited on the first and second metal films, respectively. In this manner, a first gate electrode, consisting of the first metal film and first low-resistivity metal film, can be formed for the n-channel MOSFET, and a second gate electrode, consisting of the second metal film and second low-resistivity metal film, can be formed for the p-channel MOSFET. That is to say, the fifth inventive semiconductor device can be formed as intended.

According to the fifth method, in particular, each of the first and second gate electrodes is made of two types of metal films, i.e., the first metal film and first low-resistivity metal film or the second metal film and second low-resistivity metal film. Accordingly, a ratio of the volume of the first or second metal film, which determines the work function difference, to the total volume of the first or second recessed groove can be reduced. Thus, even when very small MOSFETs should be formed, the first and second recessed grooves can be filled with the low-resistivity metal films as intended.

A sixth inventive method for fabricating a semiconductor device includes the step of a) forming first and second recessed grooves by removing a part of a dielectric film deposited on a silicon substrate from a region where an n-channel MOSFET will be formed and another part of the dielectric film from a region where a p-channel MOSFET will be formed, respectively. The first and second recessed grooves are provided to form first and second gate electrodes for the n- and p-channel MOSFETs, respectively. The method further includes the steps of: b) forming first and second gate insulating films on the bottom of the first and second recessed grooves, respectively; and c) defining a first resist pattern on the dielectric film so that the second recessed groove is exposed but that the first recessed groove is covered with the first resist pattern. The method further includes the step of d) forming a first metal film, having a first recess, inside the second recessed groove by depositing a first metal or a compound thereof over the dielectric film and the first resist pattern, and then lifting the first resist pattern off along with excessive parts of the first metal or the compound thereof that have been deposited on the first resist pattern. The first metal has a work function located closer to the valence band of silicon with reference to an intermediate level of silicon bandgap. The method further includes the steps of: e) defining a second resist pattern on the dielectric film so that the first recessed groove is exposed but that the first recess is covered with the second resist pattern; and f) forming a second metal film, having a second recess, inside the first recessed groove by depositing a second metal or a compound thereof over the dielectric film and the second resist pattern, and then lifting the second resist pattern off along with excessive parts of the second metal or the compound thereof that have been deposited on the second resist pattern. The second metal has a work function located closer to the conduction band of silicon with reference to the intermediate level of silicon bandgap. The method further includes the step of g) forming first and second low-resistivity metal films inside the first and second recesses, respectively, by depositing a low-resistivity metal over the dielectric film. And the method further includes the step of h) removing excessive parts of the low-resistivity metal and the second and first metals or the compounds thereof that have been deposited over the dielectric film, thereby forming the first and second gate electrodes for the n- and p-channel MOSFETs, respectively, so that the first gate electrode includes the second metal film and the second low-resistivity metal film and that the second gate electrode includes the first metal film and the first low-resistivity metal film.

In the sixth inventive method, a first metal film, made of a first metal with a work function located closer to the valence band of silicon with reference to an intermediate level of silicon bandgap or a compound thereof, is selectively deposited inside a second recessed groove using a first resist pattern. Then, a second metal film, made of a second metal with a work function located closer to the conduction band of silicon with reference to an intermediate level of silicon bandgap or a compound thereof, is selectively deposited inside a first recessed groove using a second resist pattern. Thereafter, first and second low-resistivity metal films are deposited on the first and second metal films, respectively. In this manner, a first gate electrode, consisting of the second metal film and second low-resistivity metal film, can be formed for the n-channel MOSFET, and a second gate electrode, consisting of the first metal film and first low-resistivity metal film, can be formed for the p-channel MOSFET. That is to say, the fifth inventive semiconductor device can be formed as intended.

According to the sixth method, in particular, each of the first and second gate electrodes is made of two types of metal films, i.e., the second metal film and second low-resistivity metal film or the first metal film and first low-resistivity metal film. Accordingly, a ratio of the volume of the second or first metal film, which determines the work function difference, to the total volume of the first or second recessed groove can be reduced. Thus, even when very small MOSFETs should be formed, the first and second recessed grooves can be filled with the low-resistivity metal films as intended.

BRIEF DESCRIPTION OF THE DRAWINGS

FIGS. 1A through 1H are cross-sectional views illustrating respective process steps for fabricating a semiconductor device according to a first embodiment of the present invention.

FIGS. 2A through 2D are cross-sectional views illustrating respective process steps for fabricating a semiconductor device according to a modified example of the first embodiment.

FIGS. 4A through 4D are cross-sectional views illustrating respective process steps for fabricating a semiconductor device according to a modified example of the second embodiment.

FIGS. 5A through 5F are cross-sectional views illustrating respective process steps for fabricating a semiconductor device according to a third embodiment of the present invention.

FIGS. 6A through 6F are cross-sectional views illustrating respective process steps for fabricating a semiconductor device according to a modified example of the third embodiment.

DESCRIPTION OF THE PREFERRED EMBODIMENTS

EMBODIMENT 1

Figure 1E:
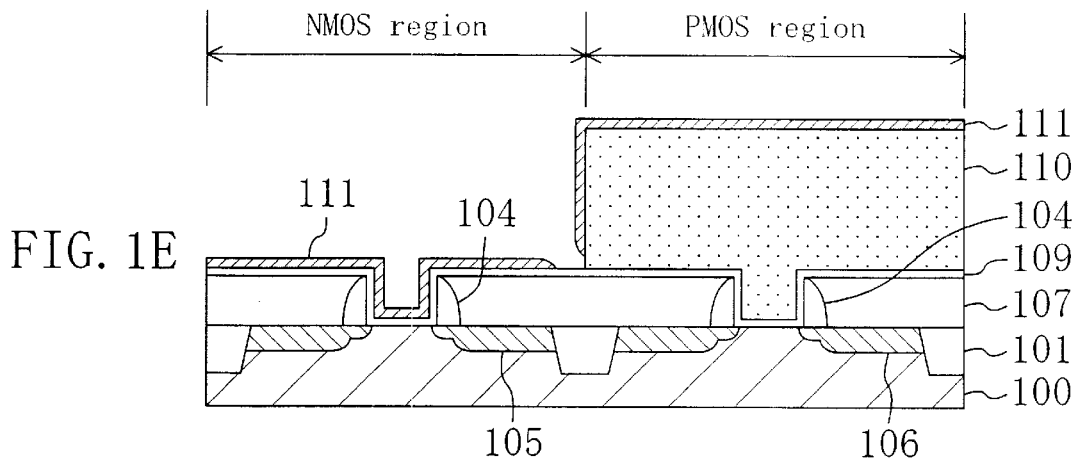

Hereinafter, a semiconductor device and a fabrication process thereof according to a first embodiment of the present invention will be described with reference to FIGS. 1A through 1H.

First, as shown in FIG. 1A, isolation regions 101 and n- and p-wells (not shown) are defined near the surface of a p-type silicon substrate 100. Thereafter, silicon dioxide and polysilicon films are deposited to thicknesses of about 5 nm and about 150 nm, respectively, over the substrate 100, and then patterned, thereby forming dummy gate insulating films 102 and dummy gate electrodes 103.

Next, using the dummy gate electrodes 103 as a mask, ions of an n-type dopant (e.g., As) are implanted at an accelerating voltage of about 8 keV into a region of the substrate 100 where an n-channel MOSFET will be formed, while ions of a p-type dopant (e.g., $BF_2$) are implanted at an accelerating voltage of about 5 kev into another region of the substrate 100 where a p-channel MOSFET will be formed. In the following description, these regions will be simply called "NMOS region" and "PMOS region", respectively.

Subsequently, a silicon nitride film is deposited to a thickness of about 50 nm over the substrate 100 and then etched anisotropically, thereby forming silicon nitride sidewalls 104 on the side faces of the dummy gate electrodes 103.

Then, using the dummy gate electrodes 103 and sidewalls 104 as a mask, ions of an n-type dopant (e.g., As) are implanted at an accelerating voltage of about 40 keV into the NMOS region of the substrate 100 and ions of a p-type dopant (e.g., $BF_2$) are implanted at an accelerating voltage of about 15 keV into the PMOS region of the substrate 100. And the substrate 100 is annealed to activate these n- and p-type dopants introduced and thereby define n- and p-type doped layers 105 and 106 to be source/drain regions.

Thereafter, an interlayer dielectric film 107 of silicon dioxide is deposited by a CVD process to a thickness of about 600 nm over the substrate 100 and then has its upper surface planarized by a chemical/mechanical polishing (CMP) process, for example. In this manner, the interlayer dielectric film 107 is planarized and the dummy gate electrodes 103 are exposed as shown in FIG. 1B.

Next, the dummy gate electrodes 103 are wet-etched away using an alkaline solution like KOH to form recessed grooves 108 for gate electrodes as shown in FIG. 1C.

Then, the dummy gate insulating films 102 are also wet-etched away using hydrofluoric acid, for example. Thereafter, as shown in FIG. 1D, a $Ta_2O_5$ film 109 to be gate insulating films is deposited by a CVD process, for example, to a thickness of about 5 nm over the interlayer dielectric film 107 as well as inside the recessed grooves 108.

Subsequently, as shown in FIG. 1E, a resist pattern 110 is defined to cover the PMOS region. Thereafter, a first metal film 111 is deposited by a sputtering process to a thickness of about 10 nm over the substrate. In the illustrated embodiment, the first metal film 111 is made of either a first metal (e.g., Zr) with a work function located closer to the conduction band of silicon with reference to an intermediate level of silicon bandgap or a compound of the first metal.

Figure 1F:
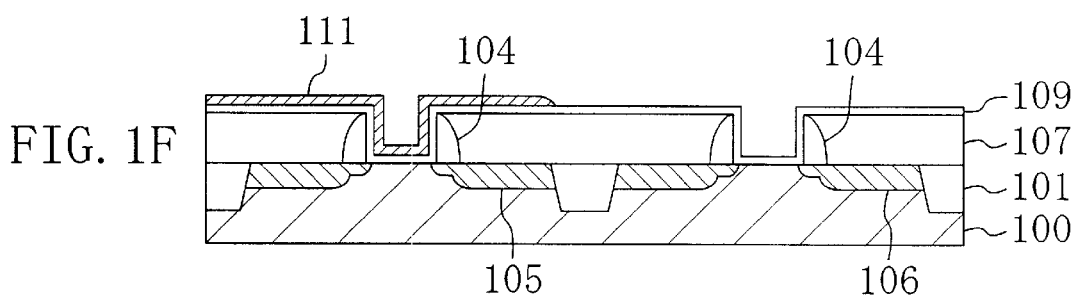

Then, as shown in FIG. 1F, the resist pattern 110 is removed, thereby lifting off excessive parts of the first metal film 111 that have been deposited on the upper and side faces of the resist pattern 110. As a result, the first metal film 111 is left only in the NMOS region.

In this process step, the resist pattern 110 may have any thickness so long as the PMOS region can be covered with the resist pattern 110 as intended. Preferably, though, the thickness of the resist pattern 110 should be 300 nm or more, which is much greater than that of the first metal film 111. This is because if the resist pattern 110 is far thicker than the first metal film 111, the first metal film 111 will be deposited discontinuously due to the step coverage unique to a sputtering process. Specifically, as shown in FIG. 1E, no part of the first metal film 111 will exist at the lower side edge of the resist pattern 110. Accordingly, those excessive parts of the first metal film 111, existing on the upper and side faces of the resist pattern 110, can be removed easily and just as intended without being left at the lower side edge of the resist pattern 110.

Figure 1G:
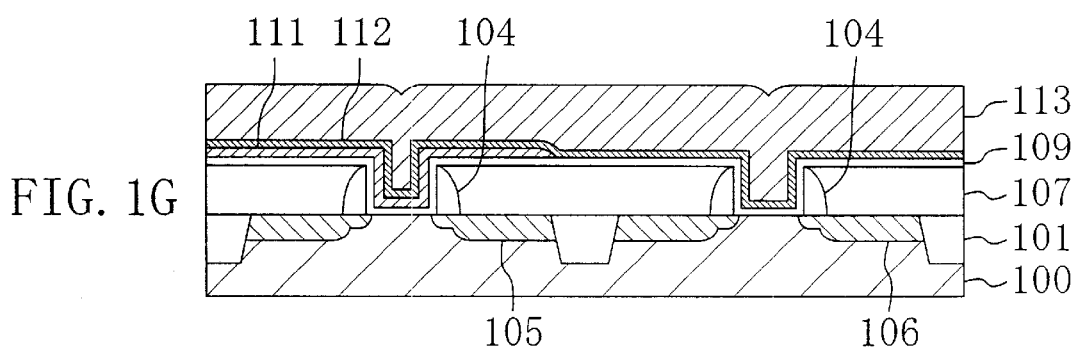

Subsequently, as shown in FIG. 1G, a second metal film 112 is deposited by a sputtering or CVD process to a thickness of about 10 nm over the substrate. In the illustrated embodiment, the second metal film 112 is made of either a second metal (e.g., Pt) with a work function located closer to the valence band of silicon with reference to an intermediate level of silicon bandgap or a compound of the second metal. Then, a low-resistivity metal film 113 of Al, for example, is deposited by a sputtering or CVD process to a thickness of about 200 nm over the second metal film 112.

Figure 1H:
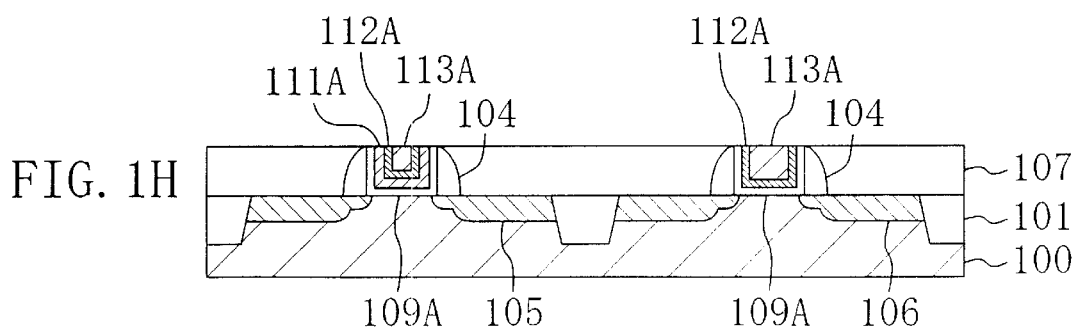

Finally, as shown in FIG. 1H, excessive parts of the low-resistivity metal film 113, second and first metal films 112 and 111 and $Ta_2O_5$ film which are exposed on the interlayer dielectric film 107 (or outside of the recessed grooves 108) are removed by a CMP process, for example. As a result, a first gate electrode, consisting of a gate insulating film 109A of $Ta_2O_5$, patterned first and second metal films 111A and 112A and patterned low-resistivity metal film 113A, is formed in the NMOS region. In the PMOS region on the other hand, a second gate electrode, consisting of the gate insulating film 109A of $Ta_2O_5$, patterned second metal film 112A and patterned low-resistivity metal film 113A, is formed.

In the first embodiment, the work function difference between the first gate electrode formed in the NMOS region and the silicon substrate 100 is the difference in work function between the patterned first metal film 111A and silicon substrate 100 that are adjacent to each other with the gate insulating film 109A interposed therebetween. In other words, the work function difference is the difference between the work function of the first metal, located closer to the conduction band of silicon with reference to an intermediate level of silicon bandgap, and that of silicon. Accordingly, the n-channel MOSFET can have its threshold voltage lowered. Also, the work function difference between the second gate electrode formed in the PMOS region and the silicon substrate 100 is the difference in work function between the patterned second metal film 112A and silicon substrate 100 that are adjacent to each other with the gate insulating film 109A interposed therebetween. In other words, the work function difference is the difference between the work function of the second metal, located closer to the valence band of silicon with reference to an intermediate level of silicon bandgap, and that of silicon. Accordingly, the p-channel MOSFET can also have its threshold voltage lowered.

In addition, the first and second gate electrodes both include the patterned low-resistivity metal film 113A made of a low-resistivity metal like Al. Thus, even if the patterned first and second metal films 111A and 112A are made of high-resistivity metals, the first and second gate electrodes will not have their resistivity increased.

Furthermore, neither the n- nor p-channel MOSFET has to be subjected to a counter-doping process through the surface of their channel region. Accordingly, short channel effects less likely show up and the performance of the MOSFETs can be enhanced.

Figure 7A:
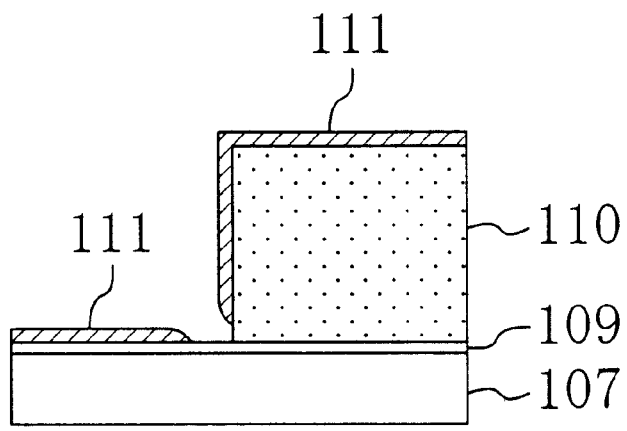
FIGS. 7A through 7C are cross-sectional views illustrating what advantages are obtainable if the first metal film is deposited by a sputtering technique according to the first embodiment.
Figure 7B:
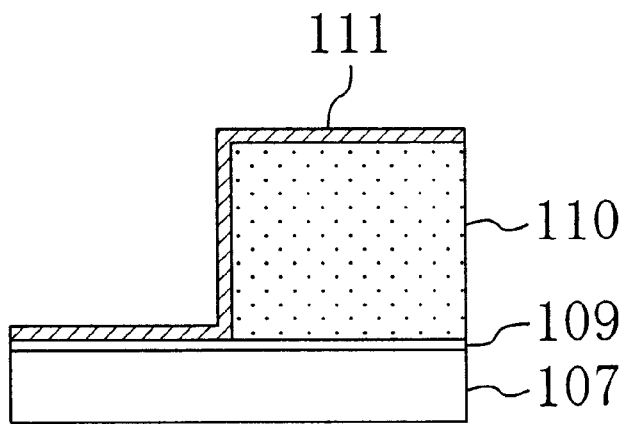
Figure 7C:
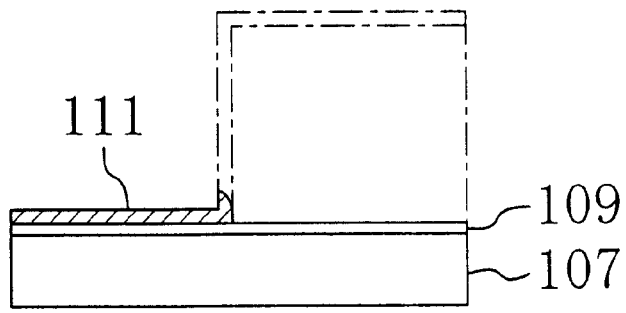
Figure 8A:
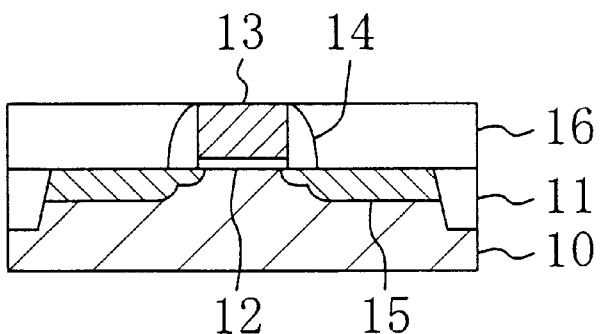
FIGS. 8A through 8D are cross-sectional views illustrating known process steps for fabricating a semiconductor device.
Figure 8B:
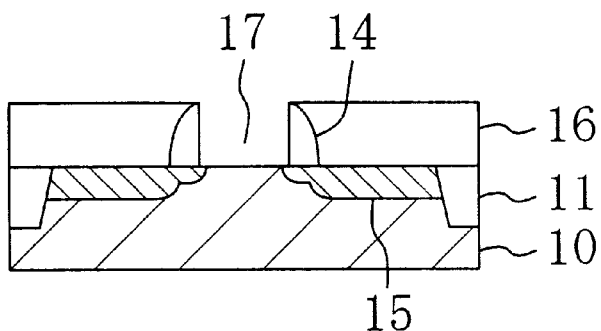
Figure 8C:
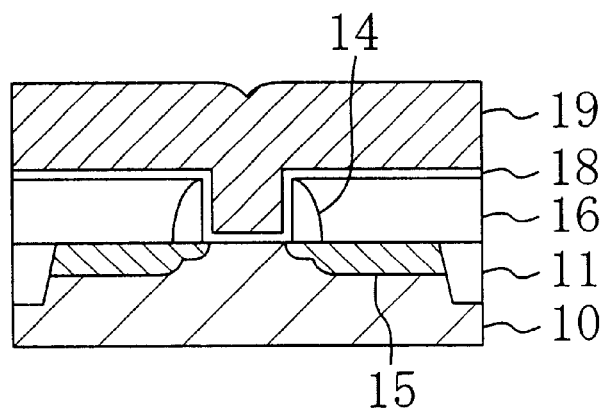
Figure 8D:
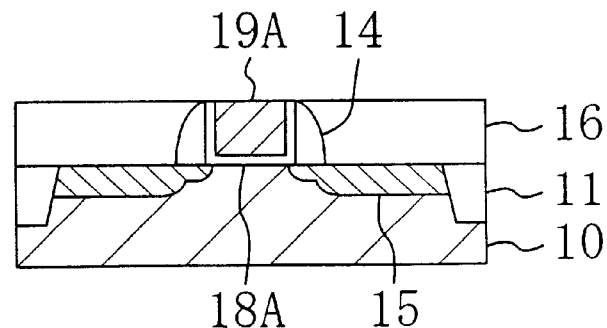

In the foregoing first embodiment, the first metal film 111 is formed by a sputtering process, but may be formed by a CVD process. Where the first metal film 111 is formed by a sputtering process, no part of the first metal film 111 will exist at the lower side edge of the resist pattern 110 as shown in FIG. 7A. On the other hand, if the first metal film 111 is formed by a CVD process, then the first metal film 111 will also cover the lower side edge of the resist pattern 110 as shown in FIG. 7B. Accordingly, if the first metal film 111 is formed by a CVD process, then part of the first metal film 111, located at the lower side edge of the resist pattern 110, will likely be left as shown in FIG. 7C even after the resist pattern 110 has been removed. In that case, when the second metal film 112 is deposited on the first metal film 111 after that, the second metal film 112 will be discontinued on the remaining part of the first metal film 111. However, that will not make a serious problem, because the excessive parts of the first and second metal films 111 and 112, existing on the interlayer dielectric film 107, will be removed anyway by the subsequent CMP process.

Modified example of Embodiment 1

Hereinafter, a semiconductor device and a fabrication process thereof according to a modified example of the first embodiment will be described with reference to FIGS. 2A through 2D.

First, as in the first embodiment, the isolation regions 101, sidewalls 104, n- and p-type doped layers 105 and 106, interlayer dielectric film 107 and recessed grooves 108 are formed around the surface of the p-type silicon substrate 100. Thereafter, as shown in FIG. 2A, a $Ta_2O_5$ film 109 to be gate insulating films is deposited by a CVD process, for example, to a thickness of about 5 nm over the interlayer dielectric film 107 as well as inside the recessed grooves 108. Subsequently, a resist pattern 150 is defined to cover the NMOS region. Then, a first metal film 151 is deposited by a sputtering process to a thickness of about 10 nm over the substrate. In this modified example, the first metal film 151 is made of either a first metal (e.g., Pt) with a work function located closer to the valence band of silicon with reference to an intermediate level of silicon bandgap or a compound of the first metal.

Then, as shown in FIG. 2B, the resist pattern 150 is removed, thereby lifting off excessive parts of the first metal film 151 that have been deposited on the upper and side faces of the resist pattern 150. In this manner, the first metal film 151 is left only in the PMOS region.

Figure 3A:
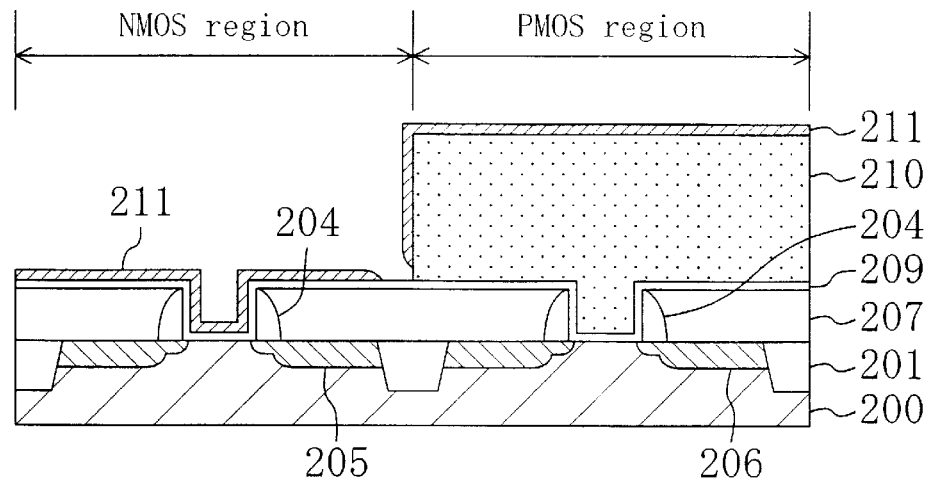
FIGS. 3A through 3D are cross-sectional views illustrating respective process steps for fabricating a semiconductor device according to a second embodiment of the present invention.
Figure 3B:
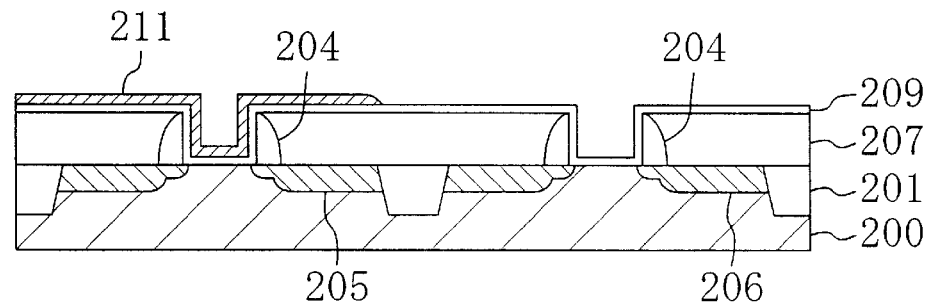
Figure 3C:
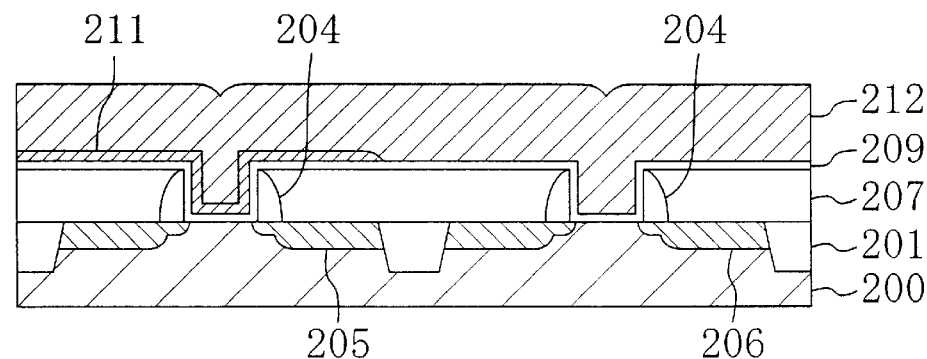

Subsequently, as shown in FIG. 3C, a second metal film 152 is deposited by a sputtering or CVD process to a thickness of about 10 nm over the substrate. In this modified example, the second metal film 152 is made of either a second metal (e.g., Zr) with a work function located closer to the conduction band of silicon with reference to an intermediate level of silicon bandgap or a compound of the second metal. Then, a low-resistivity metal film 153 of Al, for example, is deposited by a sputtering or CVD process to a thickness of about 200 nm over the second metal film 152.

Figure 3D:
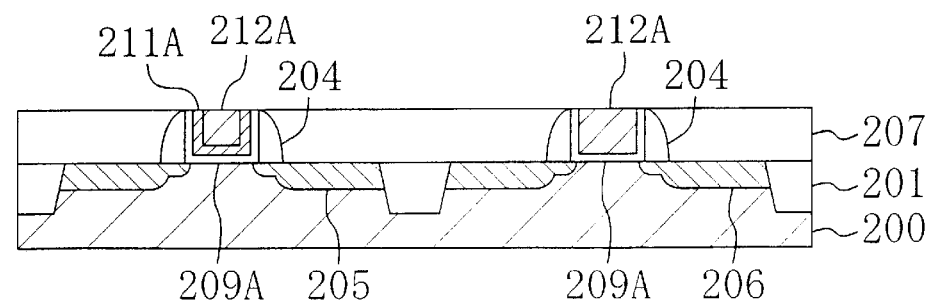

Finally, as shown in FIG. 3D, excessive parts of the low-resistivity metal film 153, second and first metal films 152 and 151 and $Ta_2O_5$ film 109, which are exposed on the interlayer dielectric film 107, are removed by a CMP process, for example. As a result, a first gate electrode, consisting of a gate insulating film 109A of $Ta_2O_5$, patterned second metal film 152A and patterned low-resistivity metal film 153A, is formed in the NMOS region. In the PMOS region on the other hand, a second gate electrode, consisting of the gate insulating film 109A of $Ta_2O_5$, patterned first and second metal films 151A and 152A and patterned low-resistivity metal film 153A, is formed.

In this modified example of the first embodiment, the work function difference between the first gate electrode formed in the NMOS region and the silicon substrate 100 is the difference in work function between the patterned second metal film 152A and silicon substrate 100 that are adjacent to each other with the gate insulating film 109A interposed therebetween. In other words, the work function difference is the difference between the work function of the second metal, located closer to the conduction band of silicon with reference to an intermediate level of silicon bandgap, and that of silicon. Accordingly, the n-channel MOSFET can have its threshold voltage lowered. Also, the work function difference between the second gate electrode formed in the PMOS region and the silicon substrate 100 is the difference in work function between the patterned first metal film 151A and silicon substrate 100 that are adjacent to each other with the gate insulating film 109A interposed therebetween. In other words, the work function difference is the difference between the work function of the first metal, located closer to the valence band of silicon with reference to an intermediate level of silicon bandgap, and that of silicon. Accordingly, the p-channel MOSFET can also have its threshold voltage lowered.

In addition, the first and second gate electrodes both include the patterned low-resistivity metal film 153A made of a low-resistivity metal like Al. Thus, even if the patterned first and second metal films 151A and 152A are made of high-resistivity metals, the first and second gate electrodes will not have their resistivity increased.

Furthermore, neither the n- nor p-channel MOSFET has to be subjected to a counter-doping process through the surface of their channel region. Accordingly, short channel effects less likely show up and the performance of the MOSFETs can be enhanced.

In the first embodiment and its modified example, the gate insulating films 109A are formed out of the $Ta_2O_5$ film 109. Alternatively, the gate insulating films 109A may be made of a high dielectric constant material such as $TiO_2$, $ZrSiO_2$, $HfSiO_2$ and $(Ba, Sr)TiO_3$ or may also be made of $SiO_2$. Also, the insulating film to be gate insulating films does not have to be formed by a CVD process but may be formed by a sputtering or PVD process.

Moreover, in the first embodiment and its modified example, Zr is used as a metal for the first or second metal film 111 or 152 (i.e., a metal with a work function located closer to the conduction band of silicon with reference to an intermediate level of silicon bandgap). Alternatively, the metal may be selected from the group consisting of Nb, Ta, Mo, V, Ti, Hf, Al, TaN and compounds thereof.

Furthermore, in the first embodiment and its modified example, Pt is used as a metal for the second or first metal film 112 or 151 (i.e., a metal with a work function located closer to the valence band of silicon with reference to an intermediate level of silicon bandgap). Alternatively, the metal may be selected from the group consisting of Ir, Re, $RuO_2$, Ni, Co and compounds thereof.

Furthermore, in the first embodiment and its modified example, Al is used as a low-resistivity metal for the low-resistivity metal film 113 or 153. Alternatively, a low melting point material like Cu or a refractory metal like W may also be used. It should be noted, however, that where a low melting point metal such as Al or Cu is used, the first metal film 111 or 151 and second metal film 112 or 152 are preferably made of metals with excellent barrier properties.

Also, in the first embodiment and its modified example, the first and second metal films 111 or 151 and 112 or 152 are deposited to about 10 nm. However, the thickness of the first and second metal films 111 or 151 and 112 or 152 is not limited thereto, but may be reduced as well. But at any thickness, these metal films should have a uniform thickness, a desired work function difference should be obtained between the silicon substrate 100 and the first or second metal film and the threshold voltages of the n- and p-channel MOSFETs should be kept low.

Furthermore, in the modified example of the first embodiment, the first metal film 151 is formed by a sputtering process, but may be formed by a CVD process instead. The advantages of the first embodiment are also obtained when the first metal film 151 is formed by a sputtering process.

EMBODIMENT 2

Hereinafter, a semiconductor device and a fabrication process thereof according to a second embodiment of the present invention will be described with reference to FIGS. 3A through 3D.

First, as in the first embodiment, isolation regions 201, sidewalls 204, n- and p-type doped layers 205 and 206, interlayer dielectric film 207 and recessed grooves are formed around the surface of a p-type silicon substrate 200. Thereafter, as shown in FIG. 3A, a $Ta_2O_5$ film 209 to be gate insulating films is deposited by a CVD process, for example, to a thickness of about 5 nm over the interlayer dielectric film 207 as well as inside the recessed grooves. Subsequently, a resist pattern 210 is defined to cover the PMOS region. Thereafter, a metal film 211 is deposited by a sputtering process to a thickness of about 10 nm over the substrate. In the illustrated embodiment, the metal film 211 is made of either a first metal (e.g., Zr) with a work function located closer to the conduction band of silicon with reference to an intermediate level of silicon bandgap or a compound of the first metal.

Then, as shown in FIG. 3B, the resist pattern 210 is removed, thereby lifting off excessive parts of the metal film 211 that have been deposited on the upper and side faces of the resist pattern 210. In this manner, the metal film 211 is left only in the NMOS region.

Subsequently, as shown in FIG. 3C, a low-resistivity metal film 212 is deposited by a sputtering or CVD process to a thickness of about 150 nm over the substrate. In the illustrated embodiment, the low-resistivity metal film 212 is made of either a second metal (e.g., Pt), which is a low-resistivity metal with a work function located closer to the valence band of silicon with reference to an intermediate level of silicon bandgap, or a compound of the second metal.

Finally, as shown in FIG. 3D, excessive parts of the low-resistivity metal film 212, metal film 211 and $Ta_2O_5$ film 209, which are exposed on the interlayer dielectric film 207, are removed by a CMP process, for example. As a result, a first gate electrode, consisting of a gate insulating film 209A of $Ta_2O_5$, patterned metal film 211A and patterned low-resistivity metal film 212A, is formed in the NMOS region. In the PMOS region on the other hand, a second gate electrode, consisting of the gate insulating film 209A of $Ta_2O_5$ and patterned low-resistivity metal film 212A, is formed.

In the second embodiment, the work function difference between the first gate electrode formed in the NMOS region and the silicon substrate 200 is the difference in work function between the patterned metal film 211A and silicon substrate 200 that are adjacent to each other with the gate insulating film 209A interposed therebetween. In other words, the work function difference is the difference between the work function of the first metal, located closer to the conduction band of silicon with reference to an intermediate level of silicon bandgap, and that of silicon. Accordingly, the n-channel MOSFET can have its threshold voltage lowered. Also, the work function difference between the second gate electrode formed in the PMOS region and the silicon substrate 200 is the difference in work function between the patterned low-resistivity metal film 212A and silicon substrate 200 that are adjacent to each other with the gate insulating film 209A interposed therebetween. In other words, the work function difference is the difference between the work function of the second metal, located closer to the valence band of silicon with reference to an intermediate level of silicon bandgap, and that of silicon. Accordingly, the p-channel MOSFET can also have its threshold voltage lowered.

In addition, the first gate electrode includes the patterned low-resistivity metal film 212A made of a low-resistivity metal like Pt. Thus, even if the patterned metal film 211A is made of a high-resistivity metal, the first gate electrode will not have its resistivity increased.

Moreover, the second gate electrode is the patterned low-resistivity metal film 212A made of a low-resistivity metal like Pt and can also have its resistivity reduced.

Furthermore, neither the n- nor p-channel MOSFET has to be subjected to a counter-doping process through the surface of their channel region. Accordingly, short channel effects less likely show up and the performance of the MOSFETs can be enhanced.

According to the second embodiment, in particular, only two types of metal films, i.e., the metal film 211 and low-resistivity metal film 212, have to be deposited to form the first and second gate electrodes. Thus, compared to the first embodiment, the step of depositing the third metal film can be omitted and the step of removing excessive parts of the metal film from the surface of the interlayer dielectric film can be performed more easily.

Modified example of Embodiment 2

Hereinafter, a semiconductor device and a fabrication process thereof according to a modified example of the second embodiment of the present invention will be described with reference to FIGS. 4A through 4D.

First, as in the first embodiment, the isolation regions 201, sidewalls 204, n- and p-type doped layers 205 and 206, interlayer dielectric film 207 and recessed grooves are formed around the surface of the p-type silicon substrate 200. Thereafter, as shown in FIG. 4A, a $Ta_2O_5$ film 209 to be gate insulating films is deposited by a CVD process, for example, to a thickness of about 5 nm over the interlayer dielectric film 207 as well as inside the recessed grooves. Subsequently, a resist pattern 250 is defined to cover the NMOS region. Thereafter, a metal film 251 is deposited by a sputtering process to a thickness of about 10 nm over the substrate. In this modified example, the metal film 251 is made of either a first metal (e.g., Pt) with a work function located closer to the valence band of silicon with reference to an intermediate level of silicon bandgap or a compound of the first metal.

Then, as shown in FIG. 4B, the resist pattern 250 is removed, thereby lifting off excessive parts of the metal film 251 that have been deposited on the upper and side faces of the resist pattern 250. In this manner, the metal film 251 is left only in the PMOS region.

Subsequently, as shown in FIG. 4C, a low-resistivity metal film 252 is deposited by a sputtering or CVD process to a thickness of about 150 nm over the substrate. In this modified example, the low-resistivity metal film 252 is made of either a second metal (e.g., Zr), which is a low-resistivity metal with a work function located closer to the conduction band of silicon with reference to an intermediate level of silicon bandgap, or a compound of the second metal.

Finally, as shown in FIG. 4D, excessive parts of the low-resistivity metal film 252, metal film 251 and $Ta_2O_5$ film 209, which are exposed on the interlayer dielectric film 207, are removed by a CMP process, for example. As a result, a first gate electrode, consisting of a gate insulating film 209A of $Ta_2O_5$ and patterned low-resistivity metal film 252A, is formed in the NMOS region. In the PMOS region on the other hand, a second gate electrode, consisting of the gate insulating film 209A of $Ta_2O_5$, patterned metal film 251A and patterned low-resistivity metal film 252A, is formed.

In this modified example of the second embodiment, the work function difference between the first gate electrode formed in the NMOS region and the silicon substrate 200 is the difference in work function between the patterned low-resistivity metal film 252A and silicon substrate 200 that are adjacent to each other with the gate insulating film 209A interposed therebetween. In other words, the work function difference is the difference between the work function of the second metal, located closer to the conduction band of silicon with reference to an intermediate level of silicon bandgap, and that of silicon. Accordingly, the n-channel MOSFET can have its threshold voltage lowered. Also, the work function difference between the second gate electrode formed in the PMOS region and the silicon substrate 200 is the difference in work function between the patterned metal film 251A and silicon substrate 200 that are adjacent to each other with the gate insulating film 209A interposed therebetween. In other words, the work function difference is the difference between the work function of the first metal, located closer to the valence band of silicon with reference to an intermediate level of silicon bandgap, and that of silicon. Accordingly, the p-channel MOSFET can also have its threshold voltage lowered.

In addition, the first gate electrode is the patterned low-resistivity metal film 252A made of a low-resistivity metal like Zr and can also have its resistivity reduced.

Moreover, the second gate electrode includes the patterned low-resistivity metal film 252A made of a low-resistivity metal like Zr. Thus, even if the patterned metal film 251A is made of a high-resistivity metal, the second gate electrode will not have its resistivity increased.

Furthermore, neither the n- nor p-channel MOSFET has to be subjected to a counter-doping process through the surface of their channel region. Accordingly, short channel effects less likely show up and the performance of the MOSFETs can be enhanced.

According to this modified example of the second embodiment, in particular, only two types of metal films, i.e., the metal film 251 and low-resistivity metal film 252, have to be deposited to form the first and second gate electrodes. Thus, compared to the first embodiment, the step of depositing the third metal film can be omitted and the step of removing excessive parts of the metal film from the surface of the interlayer dielectric film can be performed more easily.

In the second embodiment and its modified example, the gate insulating films 209A are formed out of the $Ta_2O_5$ film 209. Alternatively, the gate insulating films 209A may be made of a high dielectric constant material such as $TiO_2$, $ZrSiO_2$, $HfSiO_2$ and $(Ba, Sr)TiO_3$ or may also be made of $SiO_2$. Also, the insulating film to be gate insulating films does not have to be formed by a CVD process but may be formed by a sputtering or PVD process.

Moreover, in the second embodiment, Zr is used as a metal for the metal film 211 (i.e., a metal with a work function located closer to the conduction band of silicon with reference to an intermediate level of silicon bandgap). Alternatively, the metal may be selected from the group consisting of Nb, Ta, Mo, V, Ti, Hf, Al, TaN and compounds thereof.

Furthermore, in the second embodiment, Pt is used as a metal for the low-resistivity metal film 212 (i.e., a metal with a work function located closer to the valence band of silicon with reference to an intermediate level of silicon bandgap). Alternatively, the metal may be selected from the group consisting of Ir, Ni, Co and compounds thereof.

Furthermore, in the modified example of the second embodiment, Pt is used as a metal for the metal film 251 (i.e., a metal with a work function located closer to the valence band of silicon with reference to an intermediate level of silicon bandgap). Alternatively, the metal may be selected from the group consisting of Ir, Re, $RuO_2$, Ni, Co and compounds thereof.

Furthermore, in the modified example of the second embodiment, Zr is used as a metal for the low-resistivity metal film 252 (i.e., a metal with a low resistivity and a work function located closer to the conduction band of silicon with reference to an intermediate level of silicon bandgap).

Alternatively, the metal may be selected from the group consisting of Mo, Al and compounds thereof. Also, in the second embodiment and its modified example, the metal film 211 or 251 is deposited to about 10 nm. However, the thickness of the metal film 211 or 251 is not limited thereto, but may be reduced as well. But at any thickness, the metal film 211 or 251 should have a uniform thickness, a desired work function difference should be obtained between the silicon substrate 200 and the metal film 211 or 251 and the threshold voltages of the n- and p-channel MOSFETs should be kept low.

Furthermore, in the second embodiment and its modified example, the metal film 211 or 251 is formed by a sputtering process, but may be formed by a CVD process instead. The advantages of the first embodiment are also obtained when the metal film 211 or 251 is formed by a sputtering process.

EMBODIMENT 3

Hereinafter, a semiconductor device and a fabrication process thereof according to a third embodiment of the present invention will be described with reference to FIGS. 5A through 5F.

First, as in the first embodiment, isolation regions 301, sidewalls 304, n- and p-type doped layers 305 and 306, interlayer dielectric film 307 and recessed grooves are formed around the surface of a p-type silicon substrate 300. Thereafter, as shown in FIG. 5A, a $Ta_2O_5$ film 309 to be gate insulating films is deposited by a CVD process, for example, to a thickness of about 5 nm over the interlayer dielectric film 307 as well as inside the recessed grooves.

Subsequently, a first resist pattern 310 is defined to cover the PMOS region. Thereafter, a first metal film 311 is deposited by a sputtering process to a thickness of about 10 nm over the substrate. In the illustrated embodiment, the first metal film 311 is made of either a first metal (e.g., Zr) with a work function located closer to the conduction band of silicon with reference to an intermediate level of silicon bandgap or a compound of the first metal.

Then, as shown in FIG. 5B, the first resist pattern 310 is removed, thereby lifting off excessive parts of the first metal film 311 that have been deposited on the upper and side faces of the first resist pattern 310. In this manner, the first metal film 311 is left only in the NMOS region.

Next, as shown in FIG. 5C, a second resist pattern 312 is defined to cover the NMOS region. Thereafter, a second metal film 313 is deposited by a sputtering process to a thickness of about 10 nm over the substrate. In the illustrated embodiment, the second metal film 313 is made of either a second metal (e.g., Pt) with a work function located closer to the valence band of silicon with reference to an intermediate level of silicon bandgap or a compound of the second metal.

Figure 5D:
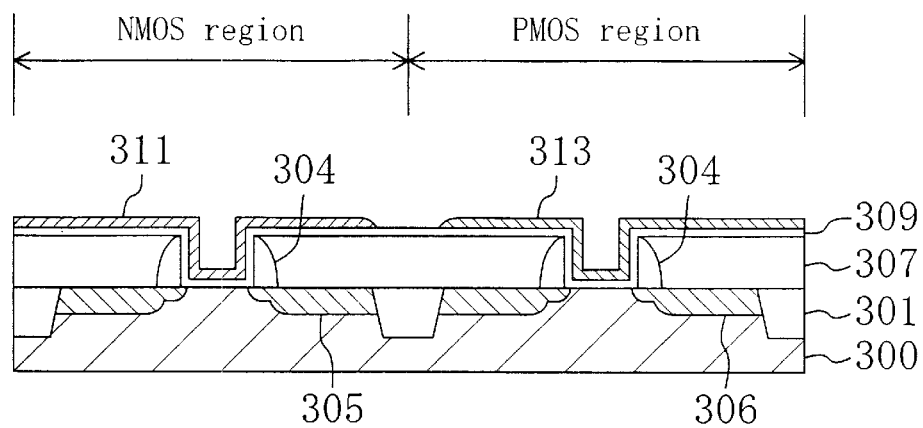

Then, as shown in FIG. 5D, the second resist pattern 312 is removed, thereby lifting off excessive parts of the second metal film 313 that have been deposited on the upper and side faces of the second resist pattern 312. In this manner, the second metal film 313 is left only in the PMOS region.

Figure 5E:
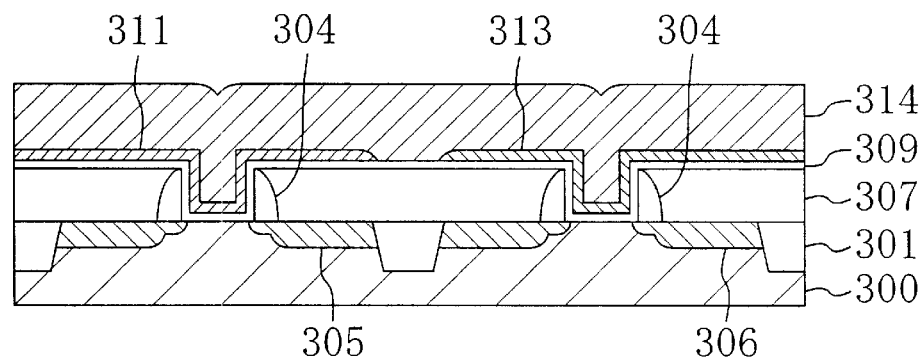

Subsequently, as shown in FIG. 5E, a low-resistivity metal film 314 of Al, for example, is deposited by a sputtering or CVD process to a thickness of about 200nm over the first and second metal films 311 and 313.

Figure 5F:
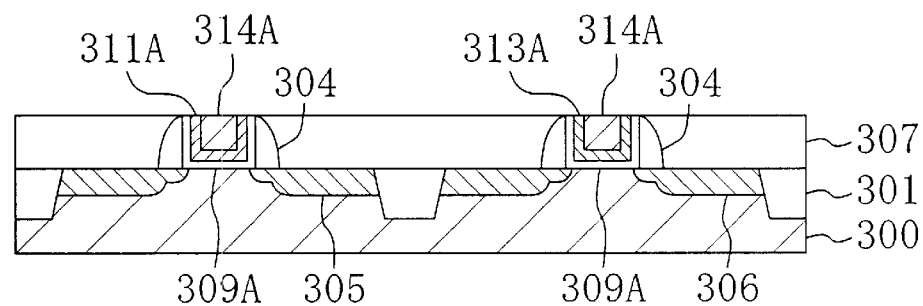

Finally, as shown in FIG. 5F, excessive parts of the low-resistivity metal film 314, second and first metal films 313 and 311 and $Ta_2O_5$ film 309, which are exposed on the interlayer dielectric film 307, are removed by a CMP process, for example. As a result, a first gate electrode, consisting of a gate insulating film 309A of $Ta_2O_5$, patterned first metal film 311A and patterned low-resistivity metal film 314A, is formed in the NMOS region. In the PMOS region on the other hand, a second gate electrode, consisting of the gate insulating film 309A of $Ta_2O_5$, patterned second metal film 313A and patterned low-resistivity metal film 314A, is formed.

Modified example of Embodiment 3

Hereinafter, a semiconductor device and a fabrication process thereof according to a modified example of the third embodiment of the present invention will be described with reference to FIGS. 6A through 6F.

First, as in the first embodiment, the isolation regions 301, sidewalls 304, n- and p-type doped layers 305 and 306, interlayer dielectric film 307 and recessed grooves are formed around the surface of the p-type silicon substrate 300. Thereafter, as shown in FIG. 6A, the $Ta_2O_5$ film 309 to be gate insulating films is deposited by a CVD process, for example, to a thickness of about 5 nm over the interlayer dielectric film 307 as well as inside the recessed grooves.

Subsequently, a first resist pattern 350 is defined to cover the NMOS region. Thereafter, a first metal film 351 is deposited by a sputtering process to a thickness of about 10 nm over the substrate. In this modified example, the first metal film 351 is made of either a first metal (e.g., Pt) with a work function located closer to the valence band of silicon with reference to an intermediate level of silicon bandgap or a compound of the first metal.

Then, as shown in FIG. 6B, the first resist pattern 350 is removed, thereby lifting off excessive parts of the first metal film 351 that have been deposited on the upper and side faces of the first resist pattern 350. In this manner, the first metal film 351 is left only in the PMOS region.

Next, as shown in FIG. 6C, a second resist pattern 352 is defined to cover the PMOS region. Thereafter, a second metal film 353 is deposited by a sputtering process to a thickness of about 10 nm over the substrate. In this modified example, the second metal film 353 is made of either a second metal (e.g., Zr) with a work function located closer to the conduction band of silicon with reference to an intermediate level of silicon bandgap or a compound of the second metal.

Then, as shown in FIG. 6D, the second resist pattern 352 is removed, thereby lifting off excessive parts of the second metal film 353 that have been deposited on the upper and side faces of the second resist pattern 352. In this manner, the second metal film 353 is left only in the NMOS region.

Subsequently, as shown in FIG. 6E, a low-resistivity metal film 354 of Al, for example, is deposited by a sputtering or CVD process to a thickness of about 200nm over the first and second metal films 351 and 353.

Finally, as shown in FIG. 6F, excessive parts of the low-resistivity metal film 354, second and first metal films 353 and 351 and $Ta_2O_5$ film 309, which are exposed on the interlayer dielectric film 307, are removed by a CMP process, for example. As a result, a first gate electrode, consisting of a gate insulating film 309A of $Ta_2O_5$ patterned second metal film 353A and patterned low-resistivity metal film 354A, is formed in the NMOS region. In the PMOS region on the other hand, a second gate electrode, consisting of the gate insulating film 309A of $Ta_2O_5$, patterned first metal film 351A and patterned low-resistivity metal film 354A, is formed.

In the third embodiment and its modified example, the work function difference between the first gate electrode formed in the NMOS region and the silicon substrate 300 is the difference in work function between the patterned first metal film 311A (or second metal film 353A) and silicon substrate 300 that are adjacent to each other with the gate insulating film 309A interposed therebetween. In other words, the work function difference is the difference between the work function of the first (or second) metal, located closer to the conduction band of silicon with reference to an intermediate level of silicon bandgap, and that of silicon. Accordingly, the n-channel MOSFET can have its threshold voltage lowered.

Also, the work function difference between the second gate electrode formed in the PMOS region and the silicon substrate 300 is the difference in work function between the patterned second metal film 313A (or first metal film 351A) and silicon substrate 300 that are adjacent to each other with the gate insulating film 309A interposed therebetween. In other words, the work function difference is the difference between the work function of the second metal, located closer to the valence band of silicon with reference to an intermediate level of silicon bandgap, and that of silicon. Accordingly, the p-channel MOSFET can also have its threshold voltage lowered.

In addition, the first and second gate electrodes both include the patterned low-resistivity metal film 314A or 354A made of a low-resistivity metal like Al. Thus, even if the patterned first or second metal film 311A or 313A (or 351A or 353A) is made of a high-resistivity metal, the first or second gate electrode will not have its resistivity increased.

Furthermore, neither the n- nor p-channel MOSFET has to be subjected to a counter-doping process through the surface of their channel region. Accordingly, short channel effects less likely show up and the performance of the MOSFETs can be enhanced.

In the third embodiment and its modified example, in particular, the first and second resist patterns 310 and 312

(350 and 352) are defined, so the number of photolithographic process steps needed is larger than that of the first embodiment. However, each of the first and second gate electrodes can be made of two types of metal films, i.e., the first metal film and first low-resistivity metal film or the second metal film and second low-resistivity metal film. That is to say, a single metal film (i.e., the patterned first metal film 311A or 351A or the patterned second metal film 313A or 353A) determines the work function difference between the gate electrode and silicon substrate. Accordingly, a ratio of the volume of the metal film, determining the work function difference, to the total volume of the recessed groove can be reduced compared to the first embodiment. Thus, even when very small MOSFETs should be formed, the recessed grooves can be filled with the low-resistivity metal film 314A or 354A as intended.

In the third embodiment and its modified example, the gate insulating films 309A are formed out of the $Ta_2O_5$ film 309. Alternatively, the gate insulating films 309A may be made of a high dielectric constant material such as $TiO_2$, $ZrSiO_2$, $HfSiO_2$ and $(Ba, Sr)TiO_3$ or may also be made of $SiO_2$. Also, the insulating film to be the gate insulating films 309A does not have to be formed by a CVD process but may be formed by a sputtering or PVD process.

Moreover, in the third embodiment and its modified example, Zr is used as a metal for the first or second metal film 311 or 353 (i.e., a metal with a work function located closer to the conduction band of silicon with reference to an intermediate level of silicon bandgap). Alternatively, the metal may be selected from the group consisting of Nb, Ta, Mo, V, Ti, Hf, Al, TaN and compounds thereof.

Furthermore, in the third embodiment and its modified example, Pt is used as a metal for the second or first metal film 313 or 351 (i.e., a metal with a work function located closer to the valence band of silicon with reference to an intermediate level of silicon bandgap). Alternatively, the metal may be selected from the group consisting of Ir, Re, $RuO_2$, Ni, Co and compounds thereof.

Furthermore, in the third embodiment and its modified example, Al is used as a low-resistivity metal for the low-resistivity metal film 314 or 354. Alternatively, a low melting point material like Cu or a refractory metal with low resistivity like W may also be used. It should be noted, however, that where a low melting point metal such as Al or Cu is used, the first metal film 311 or 351 and second metal film 313 or 353 are preferably made of metals with excellent barrier properties.

Also, in the third embodiment and its modified example, the first and second metal films 311 and 313 or 351 and 353 are deposited to about 10 nm. However, the thickness of the metal films is not limited thereto, but may be reduced as well. But at any thickness, the first and second metal films 311 and 313 or 351 and 353 should have a uniform thickness, a desired work function difference should be obtained between the silicon substrate 300 and the first and second metal films 311 and 313 or 351 and 353 and the threshold voltages of the n- and p-channel MOSFETs should be kept low.

Furthermore, in the third embodiment and its modified example, the first metal film 311 or 351 is formed by a sputtering process, but may be formed by a CVD process instead. The advantages of the first embodiment are also obtained when the first metal film 311 or 351 is formed by a sputtering process.

What is claimed is:

1. A semiconductor device comprising
an n-channel MOSFET including: a first gate insulating film; and a first gate electrode formed on the first gate insulating film, where the first gate insulating film is deposited on the bottom of a first recessed groove that has been provided for forming the first gate electrode in a dielectric film deposited on a silicon substrate, and
a p-channel MOSFET including: a second gate insulating film; and a second gate electrode formed on the second gate insulating film, where the second gate insulating film is deposited on the bottom of a second recessed groove that has been provided for forming the second gate electrode in the dielectric film,
wherein the first gate electrode includes:
a first metal film, which has been deposited on the first gate insulating film, is made of a first metal or a compound thereof and has a first recess inside the first recessed groove, the first metal having a work function located closer to the conduction band of silicon with reference to an intermediate level of silicon bandgap;
a second metal film, which has been deposited on the first metal film, is made of a second metal or a compound thereof and has a second recess inside the first recess, the second metal having a work function located closer to the valence band of silicon with reference to the intermediate level of silicon bandgap; and
a first low-resistivity metal film, which is made of a low-resistivity metal and with which the second recess has been filled, and
wherein the second gate electrode includes:
a third metal film, which has been deposited on the second gate insulating film, is made of the second metal or the compound thereof and has a third recess inside the second recessed groove; and
a second low-resistivity metal film, which is made of the low-resistivity metal and with which the third recess has been filled.

2. The device of claim 1, wherein the first metal is selected from the group consisting of Zr, Nb, Ta, Mo, V, Ti, Hf, Al and TaN, and
wherein the second metal is selected from the group consisting of Pt, Ir, Re, $RuO_2$, Ni and Co.

3. A semiconductor device comprising
an n-channel MOSFET including: a first gate insulating film; and a first gate electrode formed on the first gate insulating film, where the first gate insulating film is deposited on the bottom of a first recessed groove that has been provided for forming the first gate electrode in a dielectric film deposited on a silicon substrate, and
a p-channel MOSFET including: a second gate insulating film; and a second gate electrode formed on the second gate insulating film, where the second gate insulating film is deposited on the bottom of a second recessed groove that has been provided for forming the second gate electrode in the dielectric film,
wherein the second gate electrode includes:
a first metal film, which has been deposited on the second gate insulating film, is made of a first metal or a compound thereof and has a first recess inside the second recessed groove, the first metal having a work function located closer to the valence band of silicon with reference to an intermediate level of silicon bandgap;

a second metal film, which has been deposited on the first metal film, is made of a second metal or a compound thereof and has a second recess inside the first recess, the second metal having a work function located closer to the conduction band of silicon with reference to the intermediate level of silicon bandgap; and a first low-resistivity metal film, which is made of a low-resistivity metal and with which the second recess has been filled, and wherein the first gate electrode includes:

a third metal film, which has been deposited on the first gate insulating film, is made of the second metal or the compound thereof and has a third recess inside the first recessed groove; and a second low-resistivity metal film, which is made of the low-resistivity metal and with which the third recess has been filled.

4. The device of claim 3, wherein the first metal is selected from the group consisting of Pt, Ir, Re, $RuO_2$, Ni and Co, and wherein the second metal is selected from the group consisting of Zr, Nb, Ta, Mo, V, Ti, Hf, Al and TaN.

5. A semiconductor device comprising an n-channel MOSFET including: a first gate insulating film; and a first gate electrode formed on the first gate insulating film, where the first gate insulating film is deposited on the bottom of a first recessed groove that has been provided for forming the first gate electrode in a dielectric film deposited on a silicon substrate, and a p-channel MOSFET including: a second gate insulating film; and a second gate electrode formed on the second gate insulating film, where the second gate insulating film is deposited on the bottom of a second recessed groove that has been provided for forming the second gate electrode in the dielectric film, wherein the first gate electrode includes:

a metal film, which has been deposited on the first gate insulating film, is made of a first metal or a compound thereof and has a recess inside the first recessed groove, the first metal having a work function located closer to the conduction band of silicon with reference to an intermediate level of silicon bandgap; and a first low-resistivity metal film, with which the recess is filled and which is made of a second metal or a compound thereof, the second metal being a low-resistivity metal having a work function located closer to the valence band of silicon with reference to the intermediate level of silicon bandgap, and wherein the second gate electrode includes a second low-resistivity metal film, which has been deposited on the second gate insulating film to fill the second recessed groove and is made of the second metal or the compound thereof.

6. The device of claim 5, wherein the first metal is selected from the group consisting of Zr, Nb, Ta, Mo, V, Ti, Hf, Al and TaN, and wherein the second metal is selected from the group consisting of Pt, Ir, Ni and Co.

7. A semiconductor device comprising an n-channel MOSFET including: a first gate insulating film; and a first gate electrode formed on the first gate insulating film, where the first gate insulating film is deposited on the bottom of a first recessed groove that has been provided for forming the first gate electrode in a dielectric film deposited on a silicon substrate, and a p-channel MOSFET including: a second gate insulating film; and a second gate electrode formed on the second gate insulating film, where the second gate insulating film is deposited on the bottom of a second recessed groove that has been provided for forming the second gate electrode in the dielectric film, wherein the second gate electrode includes:

a metal film, which has been deposited on the second gate insulating film, is made of a first metal or a compound thereof and has a recess inside the second recessed groove, the first metal having a work function located closer to the valence band of silicon with reference to an intermediate level of silicon bandgap; and a first low-resistivity metal film, with which the recess is filled and which is made of a second metal or a compound thereof, the second metal being a low-resistivity metal having a work function located closer to the conduction band of silicon with reference to the intermediate level of silicon bandgap, and wherein the first gate electrode includes a second low-resistivity metal film, which has been deposited on the first gate insulating film to fill the first recessed groove and is made of the second metal or the compound thereof.

8. The device of claim 7, wherein the first metal is selected from the group consisting of Pt, Ir, Re, $RuO_2$, Ni and Co, and wherein the second metal is selected from the group consisting of Zr, Mo and Al.

9. A semiconductor device comprising an n-channel MOSFET including: a first gate insulating film; and a first gate electrode formed on the first gate insulating film, where the first gate insulating film is deposited on the bottom of a first recessed groove that has been provided for forming the first gate electrode in a dielectric film deposited on a silicon substrate, and a p-channel MOSFET including: a second gate insulating film; and a second gate electrode formed on the second gate insulating film, where the second gate insulating film is deposited on the bottom of a second recessed groove that has been provided for forming the second gate electrode in the dielectric film, wherein the first gate electrode includes:

a first metal film, which has been deposited on the first gate insulating film, is made of a first metal or a compound thereof and has a first recess inside the first recessed groove, the first metal having a work function located closer to the conduction band of silicon with reference to an intermediate level of silicon bandgap; and a first low-resistivity metal film, with which the first recess is filled and which is made of a low-resistivity metal, and wherein the second gate electrode includes:

a second metal film, which has been deposited on the second gate insulating film, is made of a second metal or a compound thereof and has a second recess inside the second recessed groove, the second metal having a work function located closer to the valence band of silicon with reference to the intermediate level of silicon bandgap; and a second low-resistivity metal film, with which the second recess is filled and which is made of the low-resistivity metal.

10. The device of claim 9, wherein the first metal is selected from the group consisting of Zr, Nb, Ta, Mo, V, Ti, Hf, Al and TaN, and wherein the second metal is selected from the group consisting of Pt, Ir, Re, $RuO_2$, Ni and Co.

* * * * *